(12) United States Patent
Yoneda et al.

(10) Patent No.: US 10,749,494 B2
(45) Date of Patent: Aug. 18, 2020

(54) NOISE FILTER CIRCUIT

(71) Applicant: Mitsubishi Electric Corporation, Tokyo (JP)

(72) Inventors: Satoshi Yoneda, Tokyo (JP); Kenji Hirose, Tokyo (JP); Yoshiyuki Kusano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/315,538

(22) PCT Filed: Aug. 3, 2016

(86) PCT No.: PCT/JP2016/072762
§ 371 (c)(1),
(2) Date: Jan. 4, 2019

(87) PCT Pub. No.: WO2018/025342
PCT Pub. Date: Feb. 8, 2018

(65) Prior Publication Data
US 2019/0341902 A1     Nov. 7, 2019

(51) Int. Cl.
| | | |
|---|---|---|
| H03H 7/01 | (2006.01) | |
| H03H 1/00 | (2006.01) | |
| H03H 7/42 | (2006.01) | |
| H05K 1/16 | (2006.01) | |
| H05K 1/18 | (2006.01) | |

(52) U.S. Cl.
CPC ............ *H03H 7/17* (2013.01); *H03H 7/0115* (2013.01); *H03H 7/425* (2013.01); *H05K 1/165* (2013.01); *H05K 1/181* (2013.01); *H03H 1/0007* (2013.01); *H03H 2001/0085* (2013.01); *H05K 2201/09263* (2013.01); *H05K 2201/1006* (2013.01); *H05K 2201/10015* (2013.01)

(58) Field of Classification Search
CPC ............ H03H 7/425; H03H 1/0007; H03H 2001/0085; H03H 7/0115; H03H 7/17
USPC .................................................. 333/175, 185
See application file for complete search history.

(56) References Cited

U.S. PATENT DOCUMENTS

2019/0044490 A1*    2/2019   Kim .................... H03H 7/0115

FOREIGN PATENT DOCUMENTS

| JP | 2013-77663 A | 4/2013 |
|---|---|---|
| JP | 2016-31965 A | 3/2016 |

* cited by examiner

*Primary Examiner* — Rakesh B Patel
(74) *Attorney, Agent, or Firm* — Birch, Stewart, Kolasch & Birch, LLP

(57) ABSTRACT

A positive electrode side input loop line (10*a*) and a positive electrode side output loop line (10*b*), and a negative electrode side input loop line (11*a*) and a negative electrode side output loop line (11*b*) form two sets of coupling loops, and the loop lines of the two sets have the same winding direction, and have the same loop sizes of and relative relationship between the loop lines. A capacitor (3) is connected in series between the positive electrode side input loop line (10*a*) and the negative electrode side input loop line (11*a*).

10 Claims, 15 Drawing Sheets

NOISE FILTER CIRCUIT

TECHNICAL FIELD

The present invention relates to a noise filter circuit having a structure for canceling influence of equivalent series inductance (hereinafter referred to as an ESL).

BACKGROUND ART

The ESL is generally an inductance component existing in a path from the connection point of a capacitor to the ground point in a main line. In an equivalent circuit including the ESL, the capacitor does not function at a frequency higher than a self-resonance frequency determined by capacitance of the capacitor and the ESL. That is, the ESL is a factor that degrades filter performance of the capacitor.

Patent Literature 1 describes a circuit module having a structure for canceling such ESL (hereinafter referred to as an ESL cancellation structure).

In the ESL cancellation structure described in Patent Literature 1, a first power supply line and a second power supply line are connected together at one connection point, and the connection point and the ground are connected together by a grounding line. A bypass capacitor is connected in series in the middle of the grounding line.

The first power supply line is connected in series to a first inductor, and the second power supply line is connected in series to a second inductor. In addition, the first inductor and the second inductor are arranged to generate mutual induction such that the inductance thereof and the inductance of a parasitic inductor in the grounding line are the same in the magnitude and inverse to each other in their signs. Note that, inductance of a combined inductor of the parasitic inductor in the grounding line and a parasitic inductor in the bypass capacitor corresponds to the ESL.

In the above ESL cancellation structure, a mutual inductor generated by the mutual induction between the first inductor and the second inductor is adjusted to be equal to the ESL.

With this configuration, a result equivalent to the case where no inductance component exists in a path from the connection point between the first power supply line and the second power supply line to the ground point is obtained.

Therefore, in a filter using a bypass capacitor, it is possible to reduce degradation of the filter performance due to influence of the ESL.

CITATION LIST

Patent Literature

Patent literature 1: JP 2013-077663 A

SUMMARY OF INVENTION

Technical Problem

In Patent Literature 1, it is assumed that the ESL cancellation structure is used for a capacitor connecting a line to a ground point (hereinafter referred to as a line-to-ground capacitor), and a capacitor connecting lines together (hereinafter referred to as a line-to-line capacitor) is not assumed.

Thus, for example, when the ESL cancellation structure is used for a line-to-line capacitor connecting two main lines together, the ESL in a path in which the line-to-line capacitor is connected is canceled, but an inductor is added to one of the two main lines due to mutual induction. As a result, the degree of balance between the main lines degrades, and there is a concern that the amount of noise generation increases.

Further, since a multilayer substrate is assumed in the ESL cancellation structure described in Patent Literature 1, it is difficult to use the ESL cancellation structure for a double printed substrate whose dielectric layer is a single layer.

The present invention is intended to solve the above problem, and it is an object of the invention to obtain a noise filter circuit having an ESL cancellation structure that can be used for a double printed substrate and that can be used for a line-to-line capacitor without degrading the degree of balance between lines.

Solution to Problem

A noise filter circuit according to the present invention includes a first input line, a first output line, a second input line, a second output line, a first input loop line, a first output loop line, a second input loop line, a second output loop line, a capacitor, and a substrate.

The first input line has a first end connected to a first input terminal. The first output line has a first end connected to a first output terminal. The second input line has a first end connected to a second input terminal. The second output line has a first end connected to a second output terminal.

The first input loop line has a first end connected to a second end of the first input line. The first output loop line is connected in series between a second end of the first input loop line and a second end of the first output line. The second input loop line has a first end connected to a second end of the second input line. The second output loop line is connected in series between a second end of the second input loop line and a second end of the second output line.

The capacitor is connected in series between the second end of the first input loop line and the second end of the second input loop line.

The substrate includes a dielectric layer and on which, on a first surface of the dielectric layer, the first input line, the first output line, the second input line, the second output line, the first input loop line, the second input loop line, and the capacitor are provided, and on a second surface of the dielectric layer, the first output loop line is provided in an opposite position to the first input loop line in a thickness direction of the dielectric layer, and the second output loop line is provided in an opposite position to the second input loop line in the thickness direction of the dielectric layer.

In this configuration, a winding direction of the first input loop line is same as a winding direction of the first output loop line, and a winding direction of the second input loop line is same as a winding direction of the second output loop line.

A loop size of the first input loop line, a loop size of the first output loop line, and a relative positional relationship between the first input loop line and the first output loop line are respectively same as a loop size of the second input loop line, a loop size of the second output loop line, and a positional relationship between the second input loop line and the second output loop line.

Advantageous Effects of Invention

According to the present invention, a capacitor is connected in series between the first input loop line and the second input loop line, and two sets of coupling loops are formed, one set including the first input loop line and the first output loop line, and the other set including the second input loop line and the second output loop line. The winding directions of the loops are the same in each of the sets of the coupling loops, and the respective loop sizes of and the relative positional relationships between the loops are the same as each other between the sets of the coupling loops.

With this configuration, the ESL in the path to which the line-to-line capacitor is connected can be canceled without degrading the degree of balance between a line including the first input line and the first output line and a line including the second input line and the second output line. In addition, this configuration can also be applied to a double printed substrate.

DESCRIPTION OF EMBODIMENTS

Hereinafter, to explain the present invention in more detail, some embodiments for carrying out the present invention will be described with reference to the accompanying drawings.

First Embodiment

Figure 1:
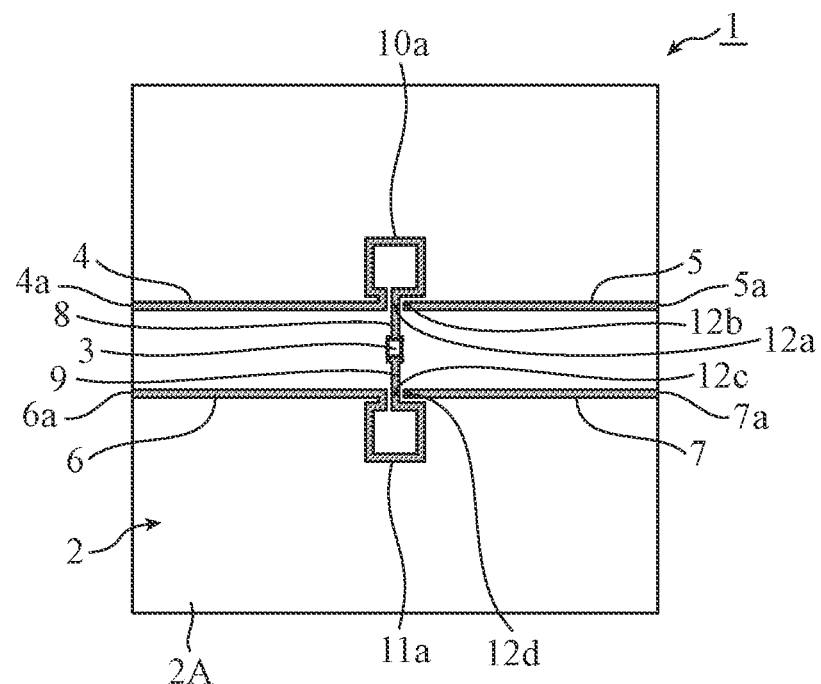
FIG. 1 is a top view illustrating a configuration of a noise filter circuit according to a first embodiment of the present invention.
Figure 2:
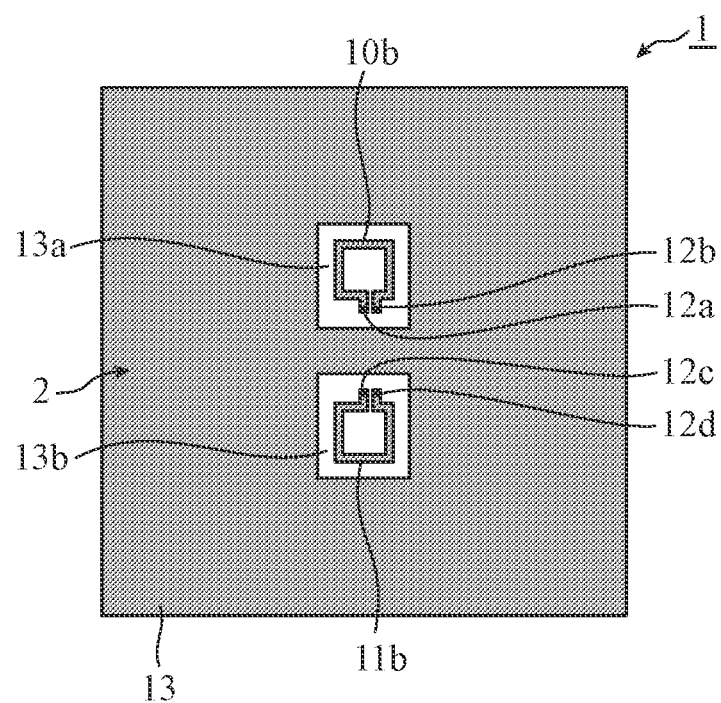
FIG. 2 is a top transparent view illustrating the configuration of the noise filter circuit according to the first embodiment.

FIG. 1 is a top view illustrating a configuration of a noise filter circuit 1 according to a first embodiment of the present invention. FIG. 2 is a top transparent view illustrating the configuration of the noise filter circuit 1.

The noise filter circuit 1 is formed on a double printed substrate 2, and a capacitor 3 is arranged on a first surface of the double printed substrate 2. The double printed substrate 2 embodies the substrate in the present invention, and includes a dielectric layer 2A being a single layer, and conductor patterns are formed on a first surface and a second surface of the dielectric layer 2A, respectively.

On the first surface of the dielectric layer 2A, a positive electrode side input line 4, a positive electrode side output line 5, a negative electrode side input line 6, a negative electrode side output line 7, a connection line 8, a connection line 9, a positive electrode side input loop line 10a, and a negative electrode side input loop line 11a are formed. In addition, on the second surface of the dielectric layer 2A, a positive electrode side output loop line 10b, a negative electrode side output loop line 11b, and a ground conductor 13 are formed.

In the dielectric layer 2A, through-holes 12a to 12d extending in the thickness direction are provided, and the conductor pattern formed on the first surface of the dielectric layer 2A and the conductor pattern formed on the second surface of the dielectric layer 2A are electrically connected to each other via the through-holes 12a to 12d.

The positive electrode side input line 4 embodies the first input line in the present invention, and a first end of the positive electrode side input line 4 is connected to a positive electrode side input terminal 4a. The positive electrode side input terminal 4a corresponds to the first input terminal in the present invention. The positive electrode side output line 5 embodies the first output line in the present invention, and a first end of the positive electrode side output line 5 is connected to a positive electrode side output terminal 5a. The positive electrode side output terminal 5a corresponds to the first output terminal in the present invention.

The negative electrode side input line 6 embodies the second input line in the present invention, and a first end of the negative electrode side input line 6 is connected to a negative electrode side input terminal 6a. The negative electrode side input terminal 6a corresponds to the second input terminal in the present invention. The negative electrode side output line 7 embodies the second output line in the present invention, and a first end of the negative electrode side output line 7 is connected to a negative electrode side output terminal 7a. The negative electrode side output terminal 7a corresponds to the second output terminal in the present invention.

A path from the positive electrode side input terminal 4a to the positive electrode side output terminal 5a is the positive electrode side path. This path includes the positive electrode side input terminal 4a, the positive electrode side input line 4, the positive electrode side input loop line 10a, the through-hole 12a, the positive electrode side output loop line 10b, the through-hole 12b, the positive electrode side output line 5, and the positive electrode side output terminal 5a that are connected together in series in this order.

A path from the negative electrode side input terminal 6a to the negative electrode side output terminal 7a is the negative electrode side path. This path includes the negative electrode side input terminal 6a, the negative electrode side input line 6, the negative electrode side input loop line 11a, the through-hole 12c, the negative electrode side output loop line 11b, the through-hole 12d, the negative electrode side output line 7, and the negative electrode side output terminal 7a that are connected together in series in this order.

The positive electrode side input loop line 10a embodies the first input loop line in the present invention, and a first end of the positive electrode side input loop line 10a is connected to a second end of the positive electrode side input line 4.

The positive electrode side output loop line 10b embodies the first output loop line in the present invention, and a first end of the positive electrode side output loop line 10b is connected to a second end of the positive electrode side output line 5.

The negative electrode side input loop line 11a embodies the second input loop line in the present invention, and a first end of the negative electrode side input loop line 11a is connected to a second end of the negative electrode side input line 6.

The negative electrode side output loop line 11b embodies the second output loop line in the present invention, and a first end of the negative electrode side output loop line 11b is connected to a second end of the negative electrode side output line 7.

Note that, in the example illustrated in FIG. 2, the ground conductor 13 is formed on a second surface side of the double printed substrate 2. Inside a region where the ground conductor 13 is formed, a portion 13a where no conductor is arranged larger than an area required to arrange the positive electrode side output loop line 10b, and a portion 13b where no conductor is arranged larger than an area required to arrange the negative electrode side output loop line 11b are provided. The positive electrode side output loop line 10b is arranged inside the portion 13a where no conductor is arranged, and the negative electrode side output loop line 11b is arranged inside the portion 13b where no conductor is arranged.

The capacitor 3 is a line-to-line capacitor connecting the positive electrode side path to the negative electrode side path, and is connected to a second end of the positive electrode side input loop line 10a via the connection line 8, and connected to a second end of the negative electrode side input loop line 11a via the connection line 9.

That is, the noise filter circuit 1 is a four-terminal circuit including a capacitor between the positive electrode side path and the negative electrode side path.

In addition, the capacitor 3 functions as a filter against so-called normal mode noise input in reverse phase between the positive electrode side input terminal 4a and the negative electrode side input terminal 6a.

Each of the positive electrode side input loop line 10a, the positive electrode side output loop line 10b, the negative electrode side input loop line 11a, and the negative electrode side output loop line 11b has a rectangular loop shape with a part thereof opened.

In addition, the positive electrode side input loop line 10a and the positive electrode side output loop line 10b are provided in opposite positions in the thickness direction of the double printed substrate 2, and the negative electrode side input loop line 11a and the negative electrode side output loop line 11b are provided in opposite positions in the thickness direction of the double printed substrate 2.

Note that, in the noise filter circuit 1, the positive electrode side input loop line 10a and the positive electrode side output loop line 10b may be arranged to be entirely opposite to each other, but may be arranged to be partially opposite to each other.

Similarly, the negative electrode side input loop line 11a and the negative electrode side output loop line 11b may be arranged to be entirely opposite to each other, but may by arranged to be partially opposite to each other.

That is, in the noise filter circuit 1, a mutual inductance value may be adjusted by shifting the position of the input loop line on the first surface of the dielectric layer 2A or the position of the output loop line on the second surface of the dielectric layer 2A.

A winding direction of a path from the first end to the second end of the positive electrode side input loop line 10a, and a winding direction of a path from the first end to a second end of the positive electrode side output loop line 10b are the same as each other.

A winding direction of a path from the first end to the second end of the negative electrode side input loop line 11a, and a winding direction of a path from the first end to a second end of the negative electrode side output loop line 11b are the same as each other.

Further, loop sizes of and a relative positional relationship between the positive electrode side input loop line 10a and the positive electrode side output loop line 10b are respectively the same as loop sizes of and a relative positional relationship between the negative electrode side input loop line 11a and the negative electrode side output loop line 11b.

Next, operation of the noise filter circuit 1 according to the first embodiment will be described.

In the noise filter circuit 1, the positive electrode side input loop line 10a and the positive electrode side output loop line 10b are magnetically coupled together, and the negative electrode side input loop line 11a and the negative electrode side output loop line 11b are magnetically coupled together. When representing each of mutual inductances generated by the respective magnetic couplings by M/2 and taking a coupling direction between the loop lines into consideration, the noise filter circuit 1 can be represented by an equivalent circuit illustrated in FIG. 3.

Figure 3:
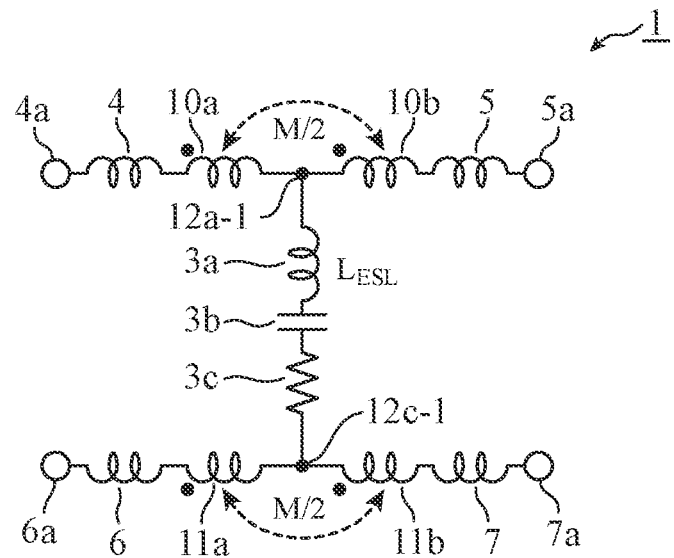
FIG. 3 is a diagram illustrating an equivalent circuit of the noise filter circuit according to the first embodiment.

A connection point 12a-1 illustrated in FIG. 3 corresponds to an arrangement position of the through-hole 12a and a connection point 12c-1 corresponds to an arrangement position of the through-hole 12c illustrated in FIGS. 1 and 2.

In the equivalent circuit illustrated in FIG. 3, a path between the connection point 12a-1 and the connection point 12c-1 is represented by a circuit in which an ESL 3a having an inductance of $L_{ESL}$, a capacitance 3b, and an equivalent series resistance 3c are connected together in series.

It is known that, for a portion in which the positive electrode side input loop line 10a and the positive electrode side output loop line 10b are magnetically coupled together as illustrated in FIG. 3, equivalent circuit conversion can be performed as follows.

To each of the positive electrode side input loop line 10a and the positive electrode side output loop line 10b, equivalent inductors each having the mutual inductance of M/2 generated by the magnetic coupling of these loop lines are connected in series. Further, to a path branching from the connection point 12a-1, an equivalent inductor having an inductance of –M/2, in which the sign of the mutual inductance generated by the magnetic coupling is reversed, is connected in series. Also on the negative electrode side input loop line 11a and the negative electrode side output loop line 11b, equivalent circuit conversion similar to the above is performed.

Figure 4:
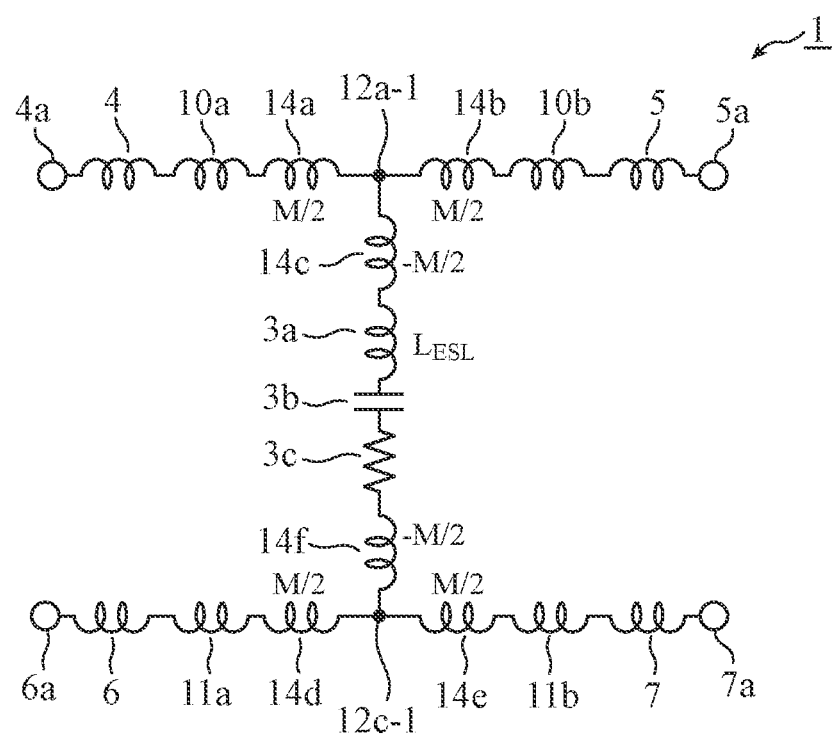
FIG. 4 is a diagram illustrating an equivalent circuit of the noise filter circuit according to the first embodiment to which equivalent circuit conversion is applied.

By applying the above equivalent circuit conversion to two magnetic coupling portions in FIG. 3, a circuit illustrated in FIG. 4 is obtained as an equivalent circuit of the noise filter circuit 1. In FIG. 4, equivalent inductors 14a to 14f are added as a result of the equivalent circuit conversion.

Each of the equivalent inductors 14a, 14b, 14d, and 14e has an inductance of M/2, and each of the equivalent inductors 14c and 14f has a negative inductance of –M/2. Thus, an inductance in the path between the connection point 12a-1 and the connection point 12c-1 is $L_{ESL}$–M.

In the noise filter circuit 1, to cause $L_{ESL}$ and M to be equal to each other, the magnetic coupling is adjusted between the positive electrode side input loop line 10a and the positive electrode side output loop line 10b, and the magnetic coupling is adjusted between the negative electrode side input loop line 11a and the negative electrode side output loop line 11b. With this adjustment, the inductance of $L_{ESL}$, which is an inductance the path between the connection point 12a-1 and the connection point 12c-1 originally has, is canceled and becomes substantially zero. As a result, it is possible to reduce degradation of filter performance due to influence of the ESL 3a.

Next, a result obtained by comparing a conventional technique and the present invention will be described.

Figure 5:
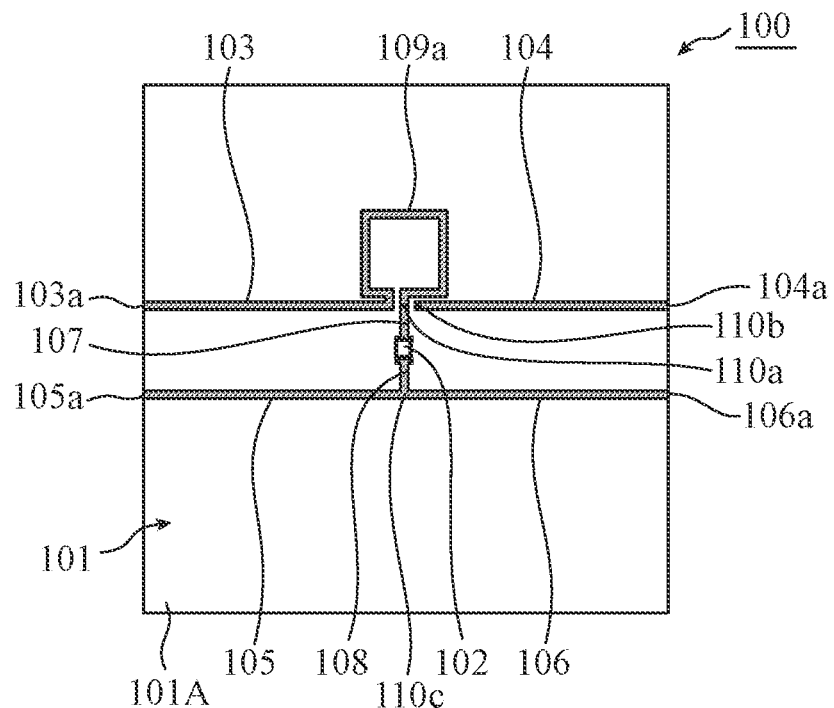
FIG. 5 is a top view illustrating a configuration of a noise filter circuit having a conventional ESL cancellation structure.
Figure 6:
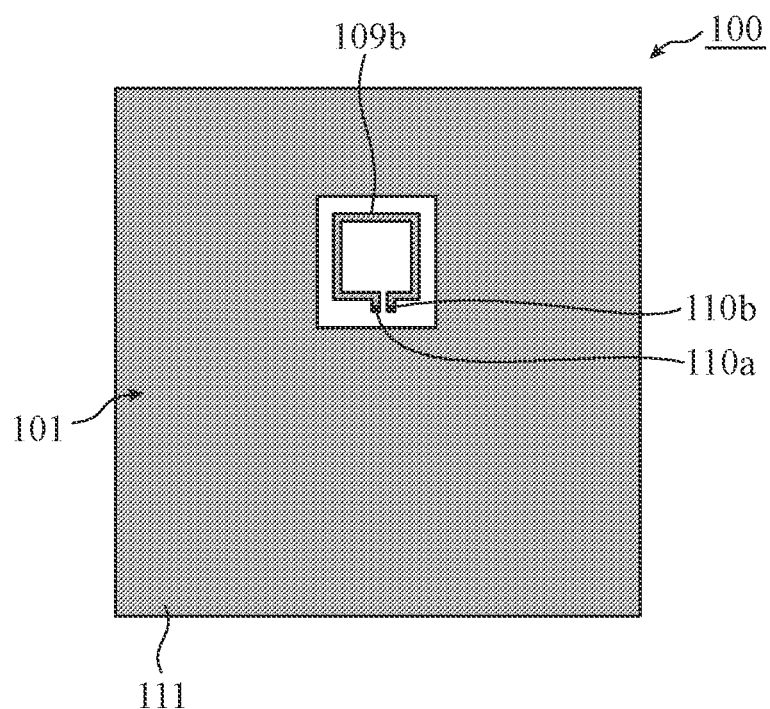
FIG. 6 is a top transparent view illustrating the configuration of the noise filter circuit having the conventional ESL cancellation structure.

FIG. 5 is a top view illustrating a configuration of a noise filter circuit 100 having a conventional ESL cancellation structure. FIG. 6 is a top transparent view illustrating the configuration of the noise filter circuit 100. The noise filter circuit 100 is formed on a double printed substrate 101, and a capacitor 102 is arranged on a first surface of the double printed substrate 101. The double printed substrate 101 has a dielectric layer 101A being a single layer, and conductor patterns are formed on a first surface and a second surface of the dielectric layer 101A, respectively.

The positive electrode side path includes a positive electrode side input terminal 103a, a positive electrode side input line 103, a connection line 107, a connection line 108, a positive electrode side input loop line 109a, a through-hole 110a, a positive electrode side output loop line 109b, a through-hole 110b, a positive electrode side output line 104, and a positive electrode side output terminal 104a that are connected in series together in this order.

The positive electrode side input line 103 is connected to the positive electrode side input terminal 103a, and the positive electrode side output line 104 is connected to the positive electrode side output terminal 104a. A negative electrode side input line 105 is connected to a negative electrode side input terminal 105a, and a negative electrode side output line 106 is connected to a negative electrode side output terminal 106a.

The capacitor 102 is a line-to-line capacitor connected between the positive electrode side path and the negative electrode side path, and is connected to the positive electrode side input loop line 109a via the connection line 107 and connected to the negative electrode side path via the connection line 108.

As described above, the noise filter circuit 100 has an ESL cancellation structure using a set of coupling loops including the positive electrode side input loop line 109a and the positive electrode side output loop line 109b.

Figure 7:
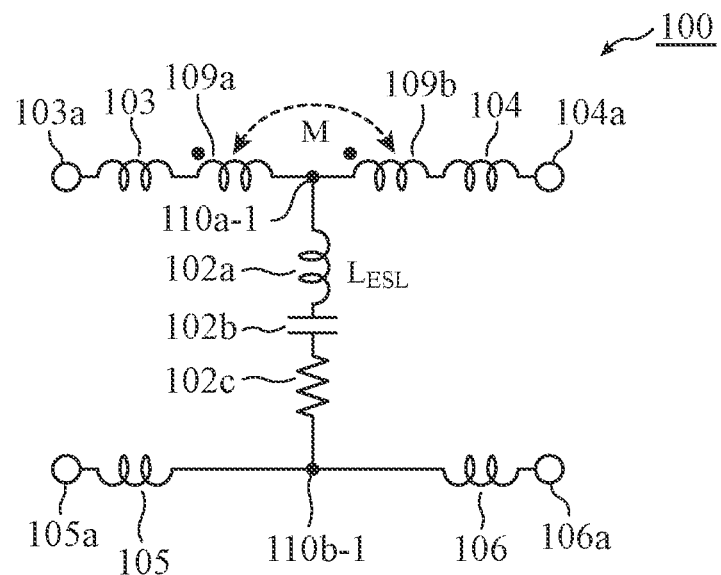
FIG. 7 is a diagram illustrating an equivalent circuit of the noise filter circuit having the conventional ESL cancellation structure.

When a mutual inductance generated by magnetic coupling between the positive electrode side input loop line 109a and the positive electrode side output loop line 109b is represented by M, a circuit illustrated in FIG. 7 is obtained as an equivalent circuit of the noise filter circuit 100.

A connection point 110a-1 corresponds to an arrangement position of the through-hole 110a illustrated in FIGS. 5 and 6. A connection point 110b-1 corresponds to a connection point 110c between the negative electrode side input line 105 and the negative electrode side output line 106. A path between the connection point 110a-1 and the connection point 110b-1 is a circuit in which an ESL 102a having an inductance of $L_{ESL}$, a capacitance 102b, and an equivalent series resistance 102c are connected together in series.

On the circuit illustrated in FIG. 7, equivalent circuit conversion described below can be performed.

To the positive electrode side input loop line 109a and the positive electrode side output loop line 109b, equivalent inductors each having the mutual inductance of M generated by the magnetic coupling of these loop lines are connected in series. Further, to a path branching from the connection point 110a-1, an equivalent inductor having an inductance of –M, in which the sign of the mutual inductance generated by the above magnetic coupling is reversed, is connected in series.

Figure 8:
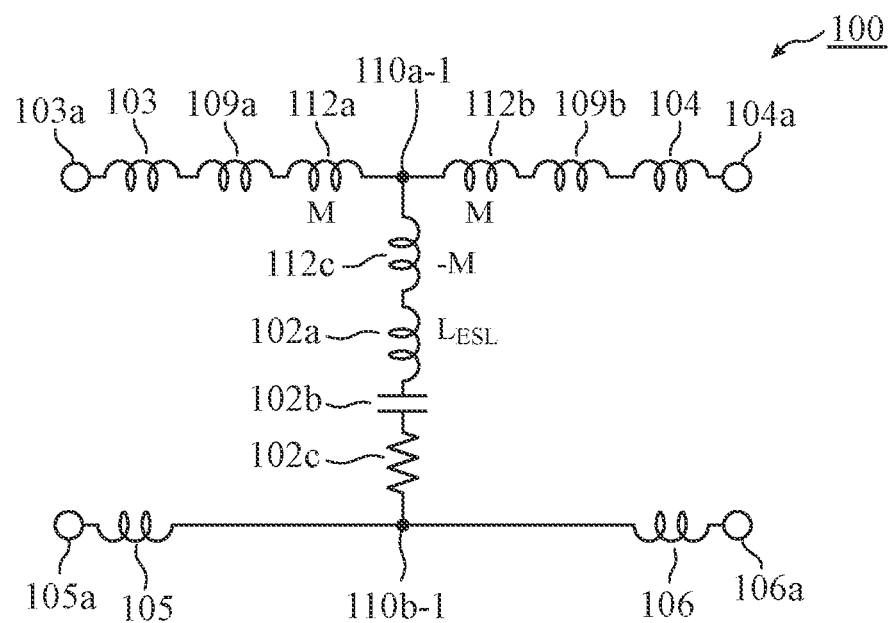
FIG. 8 is a diagram illustrating an equivalent circuit of the noise filter circuit having the conventional ESL cancellation structure to which the equivalent circuit conversion is applied.

By applying the above equivalent circuit conversion to the circuit illustrated in FIG. 7, a circuit illustrated in FIG. 8 is obtained as an equivalent circuit of the noise filter circuit 100.

FIG. 8 is a diagram illustrating the equivalent circuit of the noise filter circuit 100 to which the equivalent circuit conversion is applied. In the noise filter circuit 100, to cause the $L_{ESL}$ and M illustrated in FIG. 8 to be equal to each other, the magnetic coupling is adjusted between the positive electrode side input loop line 109a and the positive electrode side output loop line 109b.

Thus, the inductance of $L_{ESL}$, which is an inductance the path between the connection point 110a-1 and the connection point 110b-1 originally has, is canceled and becomes substantially zero. As a result, it is possible to reduce degradation of the filter performance due to influence of the ESL 102a.

In addition, a mutual inductance generated by magnetic coupling between loop shaped conductors becomes larger as a loop area of a current flowing through the loop becomes larger, and becomes smaller as the loop area becomes smaller. As a result, a circuit having a smaller loop area is preferable to hold the mutual inductance up to a higher frequency band.

As illustrated in FIG. 4, the mutual inductance generated in each of two sets of coupling loops in the noise filter circuit 1 is half of the mutual inductance of M generated in each set of coupling loops in the noise filter circuit 100. Thus, a loop area of the coupling loops in the noise filter circuit 1 is smaller than a loop area of the coupling loops in the noise filter circuit 100, so that negative mutual inductance can be held up to a higher frequency band. As a result, in the noise filter circuit 1 according to the first embodiment, it is possible to broaden the frequency band in which the degradation of the filter performance can be reduced, to the higher frequency side than that in the conventional configuration.

In addition, in the four-terminal circuit including the positive electrode side path and the negative electrode side path, the amount of noise generation can be suppressed as the degree of balance between the lines is lower. To reduce the degree of balance between the lines, the positive electrode side path and the negative electrode side path are desirably symmetrical to each other.

As described above, in the noise filter circuit 1, the coupling loops are provided in both the positive electrode side path and the negative electrode side path, and the positive electrode side path and the negative electrode side path are symmetrical to each other.

On the other hand, as is apparent from FIGS. 5 and 6, in the conventional noise filter circuit 100, the coupling loops are provided only in the positive electrode side path, and the positive electrode side path and the negative electrode side path are asymmetrical to each other.

Figure 9:
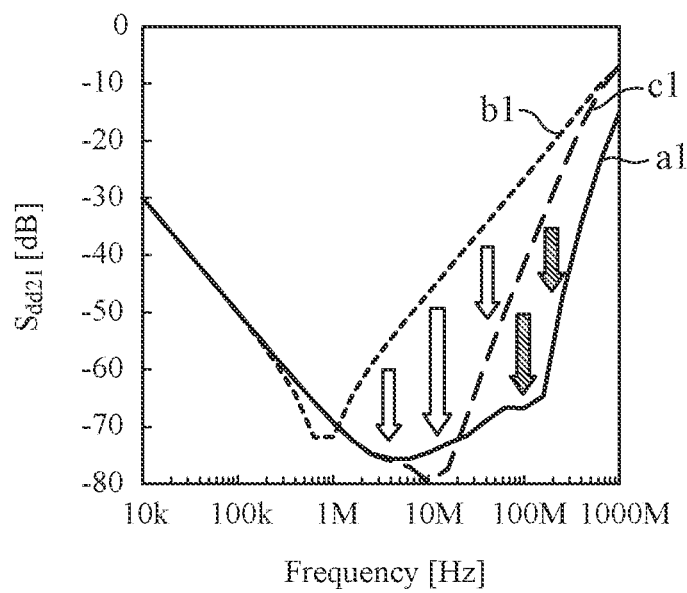
FIG. 9 is a graph illustrating an electromagnetic field calculation result ($S_{dd21}$) of a mixed mode S parameter representing filter performance for normal mode noise.
Figure 10:
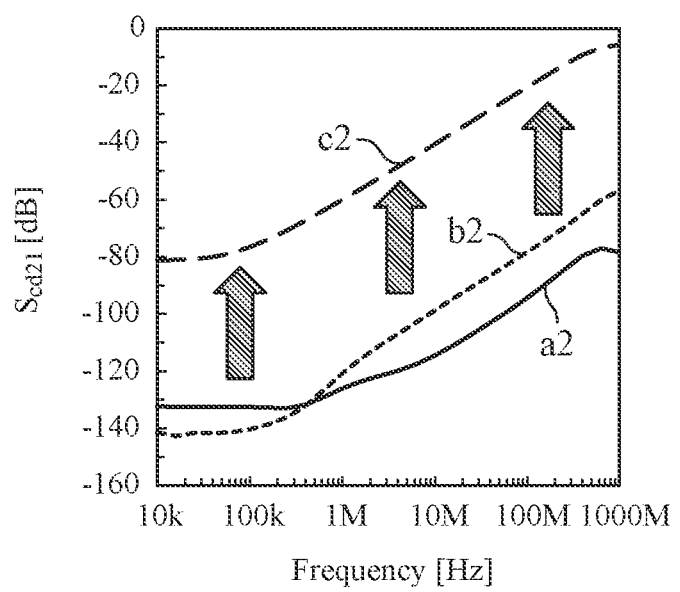
FIG. 10 is a graph illustrating an electromagnetic field calculation result ($S_{cd21}$) of a mixed mode S parameter representing the degree of balance between lines.

FIG. 9 is a graph illustrating an electromagnetic field calculation result (Sam) of a mixed mode S parameter representing the filter performance against normal mode noise. FIG. 10 is a graph illustrating an electromagnetic field calculation result ($S_{dd21}$) of a mixed mode S parameter representing the degree of balance between lines. In FIGS. 9 and 10, the horizontal axis that is a logarithmic axis indicates a frequency, and the vertical axis indicates a mixed mode S parameter (dB). In electromagnetic field calculation, a chip capacitor having a capacitance of 10 µF is used for the line-to-line capacitor, and the termination impedance of each of the input and output terminals is 50Ω.

In FIG. 9, a solid curve denoted by a reference sign a1 indicates a calculation result regarding the noise filter circuit 1, a broken curve denoted by a reference sign b1 indicates a calculation result regarding a noise filter circuit without the ESL cancellation structure. A broken curve denoted by a reference sign c1 indicates a calculation result regarding the noise filter circuit 100 having the ESL cancellation structure.

As is apparent from FIG. 9, in the conventional noise filter circuit 100, degradation of the filter performance is reduced on the higher frequency side than about 1 MHz that is the resonance frequency, as compared with the circuit without the ESL cancellation structure.

On the other hand, in the noise filter circuit 1, the frequency band in which the degradation of the filter performance is reduced is broadened to the higher frequency side than that in the conventional noise filter circuit 100.

In FIG. 10, a solid curve denoted by a reference sign a2 indicates a calculation result regarding the noise filter circuit 1. A broken curve denoted by a reference sign b2 indicates a calculation result regarding the noise filter circuit without the ESL cancellation structure. A broken curve denoted by a reference sign c2 is a calculation result regarding the noise filter circuit 100 having the ESL cancellation structure.

The conventional noise filter circuit 100 includes the coupling loops only in one side. As a result, as illustrated in FIG. 10, the degree of balance between the lines in the noise filter circuit 100 is higher than those of the noise filter circuit without the ESL cancellation structure and the noise filter circuit 1. Therefore, there is a concern about an increase in the amount of noise generation.

As described above, the noise filter circuit 1 according to the first embodiment is a four-terminal circuit in which the capacitor 3 is connected between the positive electrode side line and the negative electrode side line, and has an ESL cancellation structure using two sets of coupling loops on the positive electrode side and the negative electrode side. Since the ESL is canceled by the ESL cancellation structure, it is possible to reduce degradation of the filter performance due to influence of the ESL. In particular, it is possible to reduce degradation of the filter performance against the normal mode noise.

In addition, since the mutual inductance generated in each of the two sets of coupling loops is half of the mutual inductance generated in one set of coupling loops, the loop area of the coupling loops becomes small. Thus, it is possible to broaden the frequency band in which the degradation of the filter performance can be reduced to the high frequency side.

Further, the winding directions of the positive electrode side input and output loop lines are the same as each other, the winding directions of the negative electrode side input and output loop lines are the same as each other, and the loop sizes of and the relative positional relationship between the positive electrode side input and output loop lines are respectively the same as the loop sizes of and the relative positional relationship between the negative electrode side input and output loop lines.

Since the positive electrode side and negative electrode side paths are formed to be symmetrical to each other as described above, it is possible to keep the degree of balance between the lines low. Thus, it is possible to suppress the increase in the amount of noise generation.

Further, as illustrated in FIGS. 1 and 2, the noise filter circuit 1 implements an ESL cancellation structure using the double printed substrate 2.

In general, the double printed substrate 2 is often less expensive than multilayer substrates. Therefore, the cost of the noise filter circuit 1 can be reduced as compared with a structure like the ESL cancellation structure described in Patent Literature 1 in which a multilayer substrate is assumed.

Note that, in the above, a case has been described where the positive electrode side input loop line 10a, the positive electrode side output loop line 10b, the negative electrode side input loop line 11a, and the negative electrode side output loop line 11b each have a rectangular loop shape; however, the loop shape is not limited to a rectangular shape.

That is, it is sufficient that the loop line in the first embodiment has a shape that generates a magnetic field in a certain direction inside the loop by the current flowing through the loop path, and the loop shape may be a circle, an ellipse, a polygon such as a rectangle, or the like.

In the above, a case has been described where a chip capacitor is used as the capacitor 3; however, the capacitor 3 is not limited to a chip capacitor. For example, a capacitor such as a ceramic capacitor, a film capacitor, or an electrolytic capacitor may be used.

Further, in the four-terminal circuit including the positive electrode side path and the negative electrode side path, the ground conductor 13 is not necessarily required for operation of the circuit. Therefore, in the noise filter circuit 1 according to first embodiment, the ground conductor 13 may be omitted.

Second Embodiment

Figure 11:
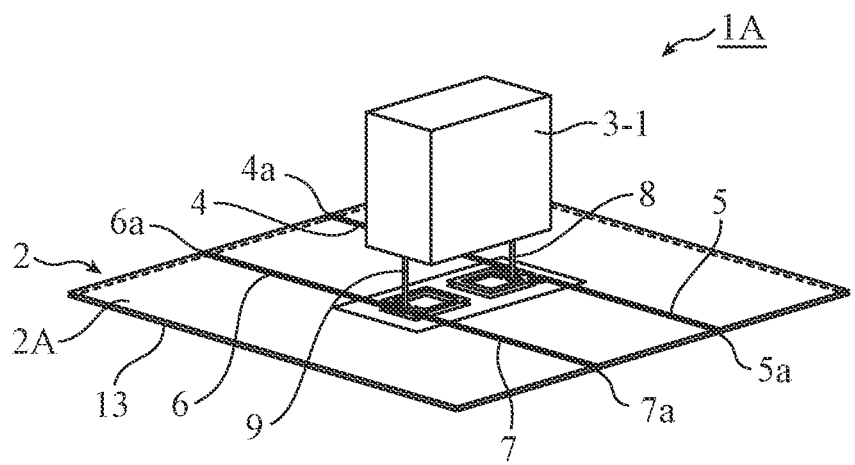
FIG. 11 is a perspective view illustrating a configuration of a noise filter circuit according to a second embodiment of the present invention.
Figure 12:
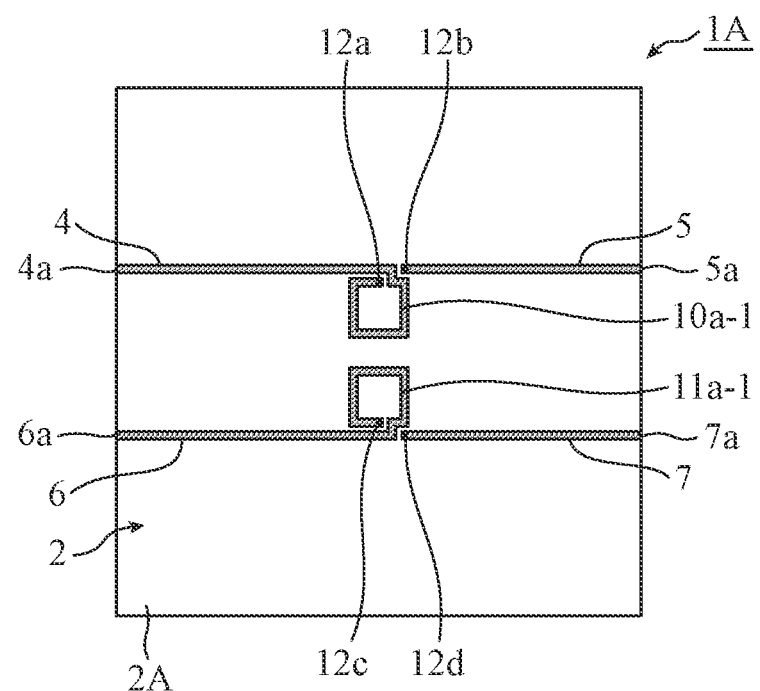
FIG. 12 is a top view illustrating the configuration of the noise filter circuit according to the second embodiment.
Figure 13:
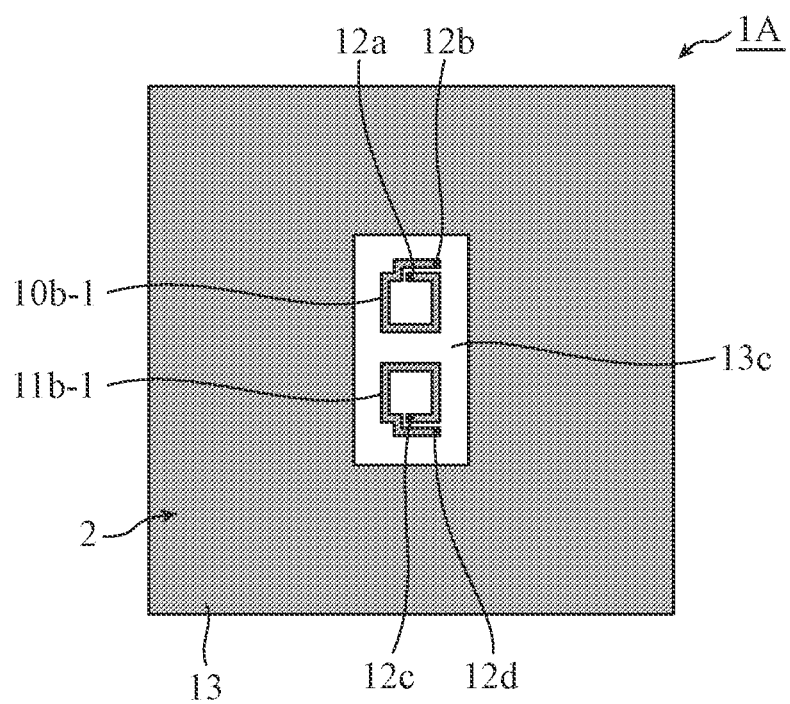
FIG. 13 is a top transparent view illustrating the configuration of the noise filter circuit according to the second embodiment.

FIG. 11 is a perspective view illustrating a configuration of a noise filter circuit 1A according to a second embodiment of the present invention. FIG. 12 is a top view illustrating the configuration of the noise filter circuit 1A. FIG. 13 is a top transparent view illustrating the configuration of the noise filter circuit 1A. In FIGS. 12 and 13, the same components as those in FIGS. 1 and 2 are denoted by the same reference signs, and description thereof is omitted.

The noise filter circuit 1A has an ESL cancellation structure using a capacitor 3-1. As illustrated in FIG. 11, a film capacitor being a lead component is assumed as the capacitor 3-1.

A positive electrode side input loop line 10a-1 embodies the first input loop line in the present invention, and a first end of the positive electrode side input loop line 10a-1 is connected to a second end of a positive electrode side input line 4.

A positive electrode side output loop line 10b-1 embodies the first output loop line in the present invention, and a first end of the positive electrode side output loop line 10b-1 is connected to a second end of a positive electrode side output line 5.

A negative electrode side input loop line 11a-1 embodies the second input loop line in the present invention, and a first end of the negative electrode side input loop line 11a-1 is connected to a second end of a negative electrode side input line 6.

A negative electrode side output loop line 11b-1 embodies the second output loop line in the present invention, and a first end of the negative electrode side output loop line 11b-1 is connected to a second end of a negative electrode side output line 7.

In the second embodiment, as illustrated in FIG. 12, the positive electrode side input loop line 10a-1 is provided on the negative electrode side of the positive electrode side path, and the negative electrode side input loop line 11a-1 is provided on the positive electrode side of the negative electrode side path.

Further, a portion 13c where no conductor is arranged is formed inside a region where a ground conductor 13 is provided on a second surface of a double printed substrate 2. The portion 13c where no conductor is arranged has an area larger than an area required to arrange the positive electrode side output loop line 10b-1 and the negative electrode side output loop line 11b-1. The positive electrode side output loop line 10b-1 and the negative electrode side output loop line 11b-1 are arranged inside the portion 13c where no conductor is arranged.

The positive electrode side input loop line 10a-1 and the positive electrode side output loop line 10b-1 are provided in opposite positions in the thickness direction of the double printed substrate 2, and the negative electrode side input loop line 11a-1 and the negative electrode side output loop line 11b-1 are provided in opposite positions in the thickness direction of the double printed substrate 2.

Note that, in the noise filter circuit 1A, the positive electrode side input loop line 10a-1 and the positive electrode side output loop line 10b-1 may be arranged to be entirely opposite to each other, but may arranged to be partially opposite to each other.

Similarly, the negative electrode side input loop line 11a-1 and the negative electrode side output loop line 11b-1 may be arranged to be entirely opposite to each other, but may be arranged to be partially opposite to each other.

That is, in the noise filter circuit 1A, a mutual inductance value may be adjusted by shifting the position of the input loop line on a first surface of the dielectric layer 2A or the position of the output loop line on a second surface of the dielectric layer 2A.

In addition, similarly to the first embodiment, a winding direction of a path from the first end to a second end of the positive electrode side input loop line 10a-1, and a winding direction of a path from the first end to a second end of the positive electrode side output loop line 10b-1 are the same as each other. A winding direction of a path from the first end to a second end of the negative electrode side input loop line 11a-1, and a winding direction of a path from the first end to a second end of the negative electrode side output loop line 11b-1 are the same as each other.

Further, sizes of and a relative positional relationship between the positive electrode side input loop line 10a-1 and the positive electrode side output loop line 10b-1 are respectively the same as sizes of and a positional relationship between the negative electrode side input loop line 11a-1 and the negative electrode side output loop line 11b-1.

With this configuration, the positive electrode side input loop line 10a-1 and the positive electrode side output loop line 10b-1, and the negative electrode side input loop line 11a-1 and the negative electrode side output loop line 11b-1 are arranged in a region below the capacitor 3-1 as illustrated in FIG. 11. Thus, it is possible to implement an ESL cancellation structure using the double printed substrate 2 with higher wiring density than that in the configuration of the first embodiment.

The electrical connection of conductor patterns in the noise filter circuit 1A is similar to those in the noise filter circuit 1 described in the first embodiment. Therefore, the equivalent circuit of the noise filter circuit 1A is the same as the circuit illustrated in FIG. 4.

That is, the noise filter circuit 1A is a four-terminal circuit in which a capacitor is connected between the positive electrode side path and the negative electrode side path, and includes two sets of coupling loops. Electrical operation of the noise filter circuit 1A is the same as that of the noise filter circuit 1. Therefore, the effects similar to those in the first embodiment can be obtained.

As described above, in the noise filter circuit 1A according to the second embodiment, the positive electrode side input loop line 10a-1 and the positive electrode side output loop line 10b-1, the negative electrode side input loop line 11a-1 and the negative electrode side output loop line 11b-1 are arranged in a region below the capacitor 3-1. With this configuration, the effects similar to those in the first embodiment are obtained, and it is possible to implement an ESL cancellation structure with a higher wiring density. Therefore, the noise filter circuit 1A can be made smaller than the configuration of the first embodiment.

Note that, in the four-terminal circuit including the positive electrode side path and the negative electrode side path, the ground conductor 13 is not necessarily required for operation of the circuit. Therefore, in the noise filter circuit 1A according to the second embodiment, the ground conductor 13 may be omitted.

Third Embodiment

Figure 14:
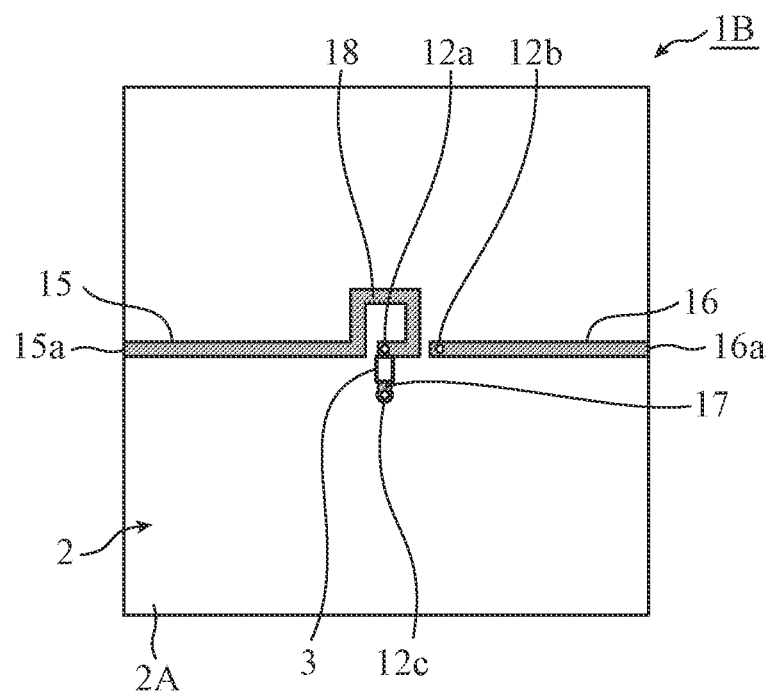
FIG. 14 is a top view illustrating a configuration of a noise filter circuit according to a third embodiment of the present invention.
Figure 15:
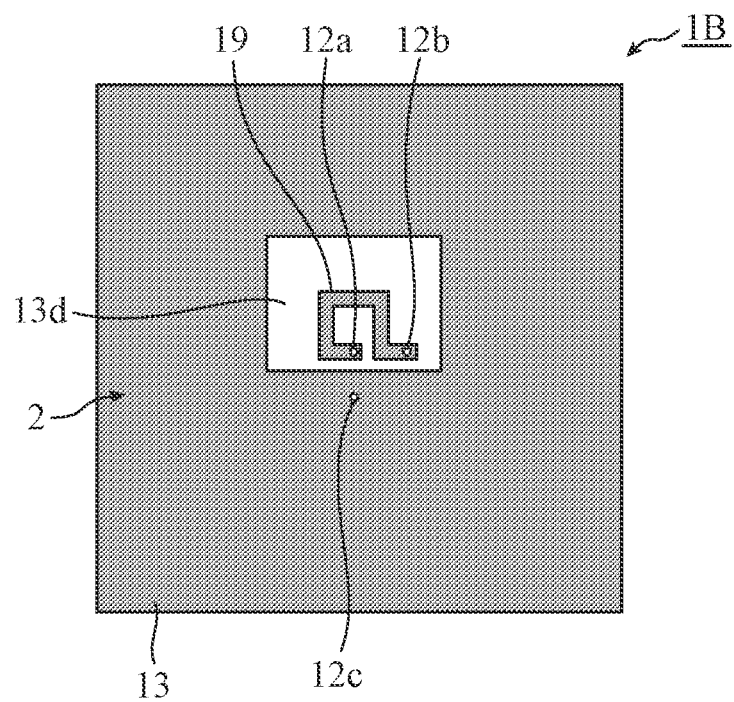
FIG. 15 is a top transparent view illustrating the configuration of the noise filter circuit according to the third embodiment.

FIG. 14 is a top view illustrating a configuration of a noise filter circuit 1B according to a third embodiment of the present invention. FIG. 15 is a top transparent view illustrating the configuration of the noise filter circuit 1B.

The noise filter circuit 1B is formed on a double printed substrate 2, and a capacitor 3 is arranged on a first surface of the double printed substrate 2. The double printed substrate 2 includes a dielectric layer 2A being a single layer, and conductor patterns are formed on a first surface and a second surface of the dielectric layer 2A, respectively.

On the first surface of the dielectric layer 2A, an input line 15, an output line 16, a connection line 17, and an input loop line 18 are formed. On the second surface of the dielectric layer 2A, a ground conductor 13 and an output loop line 19 are formed.

In addition, in the dielectric layer 2A, through-holes 12a to 12c extending in the thickness direction are provided, and the conductor patterns formed on the first surface of the dielectric layer 2A and the conductor patterns formed on the second surface of the dielectric layer 2A are electrically connected to each other via the through-holes 12a to 12c.

A first end of the input line 15 is connected to an input terminal 15a. A first end of the output line 16 is connected to an output terminal 16a.

A main path from the input terminal 15a to the output terminal 16a includes the input terminal 15a, the input line 15, the input loop line 18, the through-hole 12a, the output loop line 19, the through-hole 12b, the output line 16, and the output terminal 16a that are connected together in series in this order.

Note that, in the example illustrated in FIG. 15, the ground conductor 13 is formed on a second surface of the double printed substrate 2. Inside a region where the ground conductor 13 is formed, a portion 13d where no conductor is arranged larger than an area required to arrange the output loop line 19 is formed. The output loop line 19 is arranged inside the portion 13d where no conductor is arranged.

The input loop line 18 and the output loop line 19 each have a rectangular loop shape with a part thereof opened, and are provided in opposite positions to each other in the thickness direction of the double printed substrate 2.

Note that, in the noise filter circuit 1B, the input loop line 18 and the output loop line 19 may be arranged to be entirely opposite to each other, but may be arranged to be partially opposite to each other.

That is, in the noise filter circuit 1B, a mutual inductance value may be adjusted by shifting the position of the input loop line 18 on the first surface of the dielectric layer 2A or the position of the output loop line 19 on the second surface of the dielectric layer 2A.

In addition, a winding direction of a path from a first end to a second end of the input loop line 18, and a winding direction of a path from a first end to a second end of the output loop line 19 are the same as each other.

A first end of the capacitor 3 is connected to the input loop line 18, and a second end of the capacitor 3 is connected to the connection line 17. In addition, the connection line 17 is electrically connected to the ground conductor 13 via the through-hole 12c. That is, the noise filter circuit 1B is a two-terminal circuit in which a middle of the main line is grounded via the capacitor 3.

The capacitor 3 provided in the middle of the main line functions as a filter against noise input from the input terminal 15a.

Figure 16:
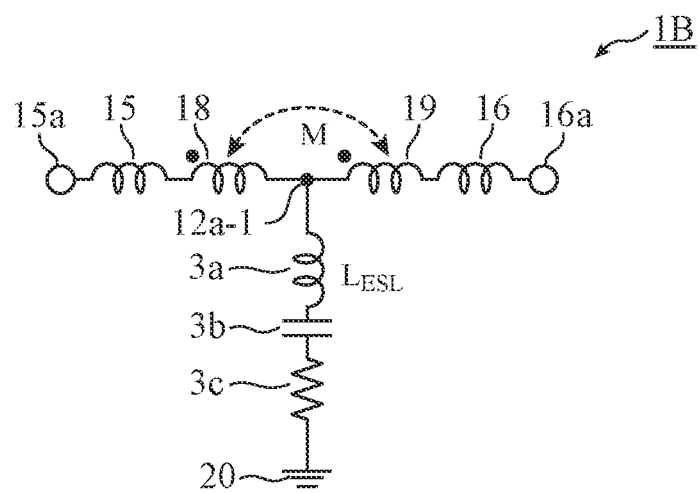
FIG. 16 is a diagram illustrating an equivalent circuit of the noise filter circuit according to the third embodiment.

In the noise filter circuit 1B, the input loop line 18 and the output loop line 19 are magnetically coupled together. When representing a mutual inductance generated by the magnetic coupling by M and taking a coupling direction between the input loop line 18 and the output loop line 19 into consideration, the noise filter circuit 1B can be represented by an equivalent circuit illustrated in FIG. 16. In FIG. 16, a connection point 12a-1 corresponds to an arrangement position of the through-hole 12a. A ground point 20 corresponds to a connection point between the through-hole 12c and the ground conductor 13.

In the equivalent circuit illustrated in FIG. 16, a path between the connection point 12a-1 and the ground point 20 is represented by a circuit in which an ESL 3a having an inductance of $L_{ESL}$, a capacitance 3b, and an equivalent series resistance 3c are connected together in series.

It is known that, for a magnetic coupling portion between the input loop line 18 and the output loop line 19 as illustrated in FIG. 16, equivalent circuit conversion can be performed as follows.

To the input loop line 18 and the output loop line 19, equivalent inductors each having the mutual inductance of M generated by the magnetic coupling of these loop lines are connected in series. Further, to a path branching from the connection point 12a-1, an equivalent inductor having an inductance of −M, in which the sign of the mutual inductance generated by the magnetic coupling is reversed, is connected in series.

Figure 17:
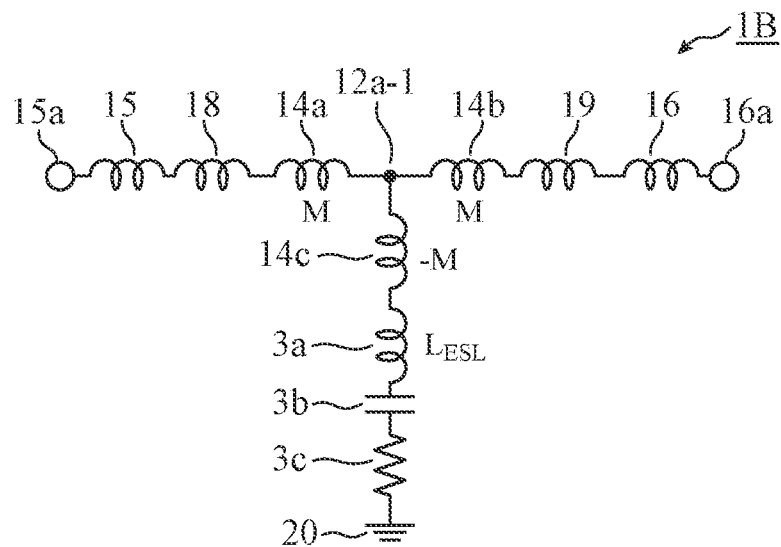
FIG. 17 is a diagram illustrating an equivalent circuit of the noise filter circuit according to the third embodiment to which the equivalent circuit conversion is applied.

By applying the above equivalent circuit conversion to the magnetic coupling portion in FIG. 16, a circuit illustrated in FIG. 17 is obtained as an equivalent circuit of the noise filter circuit 1B. In FIG. 17, equivalent inductors 14a to 14c are added as a result of the equivalent circuit conversion. The equivalent inductors 14a and 14b each have an inductance of M, and the equivalent inductor 14c has a negative inductance of −M. In this way, an inductance in the path between the connection point 12a-1 and the ground point 20 is $L_{ESL}$-M.

In the noise filter circuit 1B, to cause $L_{ESL}$ and M to be equal to each other, the magnetic coupling is adjusted between the input loop line 18 and the output loop line 19. Thus, the inductance of $L_{ESL}$, which is an inductance the path between the connection point 12a-1 and the ground point 20 originally has, is canceled and becomes substantially zero. As a result, it is possible to reduce degradation of filter performance due to influence of the ESL 3a.

Figure 18:
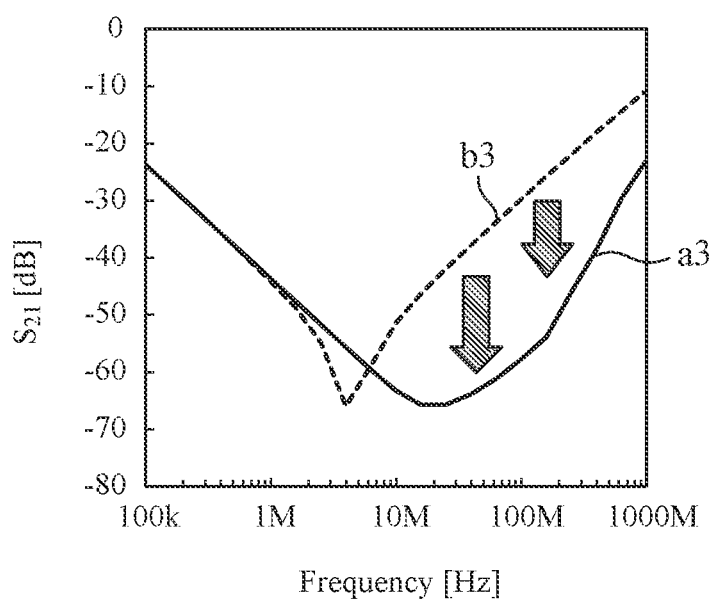
FIG. 18 is a graph illustrating an electromagnetic field calculation result ($S_{21}$) of an S parameter representing the filter performance.

FIG. 18 is a graph illustrating an electromagnetic field calculation result ($S_{21}$) of an S parameter representing the filter performance. In FIG. 18, the horizontal axis that is a logarithmic axis indicates a frequency, and the vertical axis indicates an S parameter (dB). In addition, in electromagnetic field calculation, a chip capacitor having a capacitance of 1 µF is used for the capacitor, and the termination impedance of each of the input and output terminals is assumed to be 50Ω.

A solid curve denoted by a reference sign a3 is a calculation result in the noise filter circuit 1B, and a broken curve denoted by a reference sign b3 is a calculation result in a noise filter circuit without the ESL cancellation structure.

As illustrated in FIG. 18, in the noise filter circuit 1B, degradation of the filter performance is reduced on the higher frequency side than about 4 MHz that is the resonance frequency, as compared with the circuit without the ESL cancellation structure.

As described above, the noise filter circuit 1B according to the third embodiment is a two-terminal circuit in which a middle of the main line is grounded via the capacitor 3-1, and has an ESL cancellation structure using coupling loops. Since the ESL is canceled by the ESL cancellation structure, it is possible to reduce degradation of the filter performance due to influence of the ESL.

In addition, as illustrated in FIGS. 14 and 15, the noise filter circuit 1B implements an ESL cancellation structure using the double printed substrate 2.

In general, a double printed substrate 2 is often less expensive than multilayer substrates. Therefore, the cost of the noise filter circuit 1B can be reduced as compared with s structure like the ESL cancellation structure described in Patent Literature 1 in which a multilayer substrate is assumed.

Note that, a case has been described where the input loop line 18 and the output loop line 19 each have a rectangular loop shape; however, the loop shape is not limited to a rectangular shape.

That is, it is sufficient that the loop line in the third embodiment has a shape that generates a magnetic field in a certain direction inside the loop by the current flowing through the loop path, and the loop shape may be a circle, an ellipse, a polygon such as a rectangle, or the like.

In addition, a case has been described where a chip capacitor is used as the capacitor 3; however, the capacitor 3 is not limited to a chip capacitor. For example, a capacitor such as a ceramic capacitor, a film capacitor, or an electrolytic capacitor may be used.

Fourth Embodiment

Figure 19:
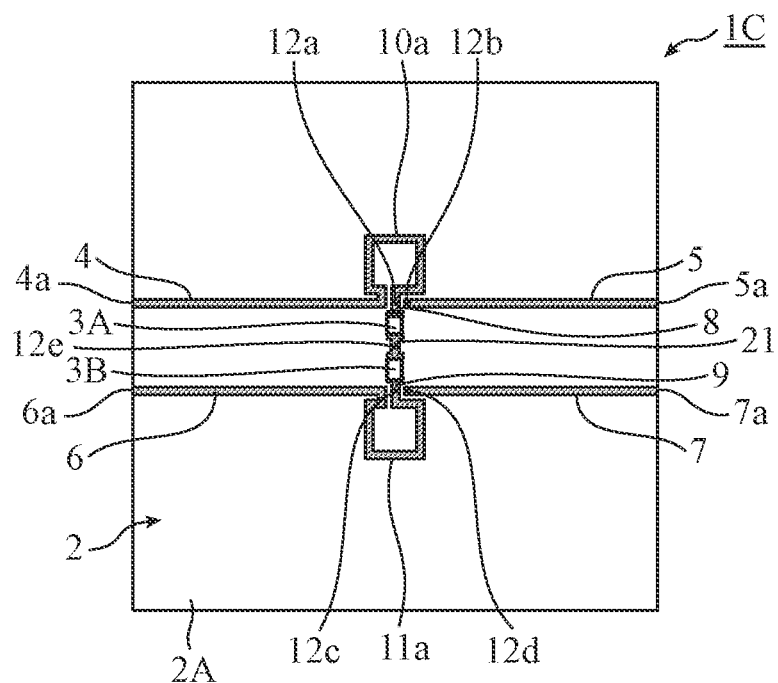
FIG. 19 is a top view illustrating a configuration of a noise filter circuit according to a fourth embodiment of the present invention.
Figure 20:
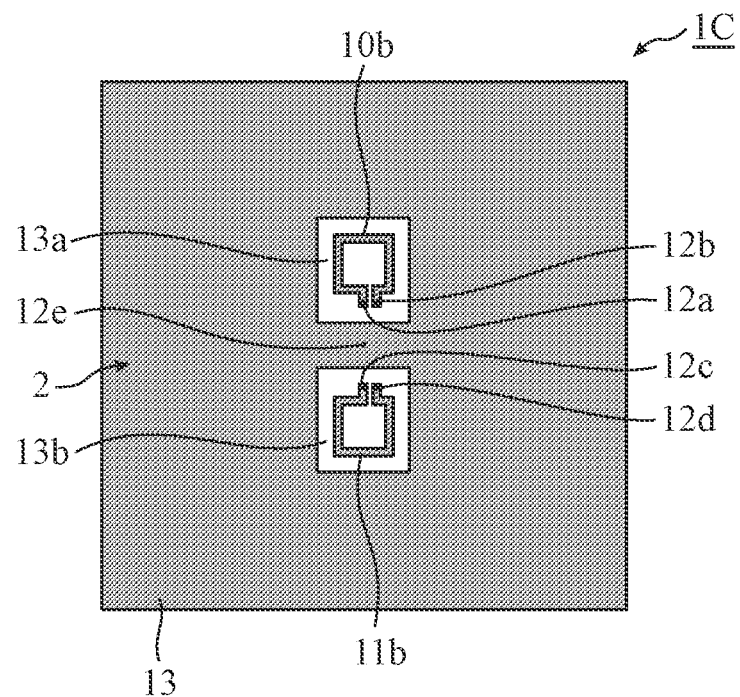
FIG. 20 is a top transparent view illustrating the configuration of the noise filter circuit according to the fourth embodiment.

FIG. 19 is a top view illustrating a configuration of the front side of a noise filter circuit 1C according to a fourth embodiment of the present invention. FIG. 20 is a top transparent view illustrating a configuration of the back side of the noise filter circuit 1C. The noise filter circuit 1C is formed on a double printed substrate 2, and a capacitor 3A and a capacitor 3B are arranged on a first surface of the double printed substrate 2. The double printed substrate 2 includes a dielectric layer 2A being a single layer, and conductor patterns are formed on a first surface and a second surface of the dielectric layer 2A, respectively.

On the first surface of the dielectric layer 2A, similarly to the first embodiment, a positive electrode side input line 4, a positive electrode side output line 5, a negative electrode side input line 6, a negative electrode side output line 7, a connection line 8, a connection line 9, a positive electrode side input loop line 10a, a negative electrode side input loop line 11a, and a connection line 21 are formed.

On the second surface of the dielectric layer 2A, a ground conductor 13, a positive electrode side output loop line 10b, and a negative electrode side output loop line 11b are formed.

In addition, in the dielectric layer 2A, through-holes 12a to 12e extending in the thickness direction are provided, and the conductor patterns formed on the first surface of the dielectric layer 2A and the conductor patterns formed on the second surface are electrically connected to each other via the through-holes 12a to 12e.

A first end of the positive electrode side input line 4 is connected to a positive electrode side input terminal 4a, and a first end of the positive electrode side output line 5 is connected to a positive electrode side output terminal 5a. A first end of the negative electrode side input line 6 is connected to a negative electrode side input terminal 6a, and a first end of the negative electrode side output line 7 is connected to a negative electrode side output terminal 7a.

A path from the positive electrode side input terminal 4a to the positive electrode side output terminal 5a is the positive electrode side path. Similarly to the first embodiment, this path includes the positive electrode side input terminal 4a, the positive electrode side input line 4, the positive electrode side input loop line 10a, the through-hole 12a, the positive electrode side output loop line 10b, the through-hole 12b, the positive electrode side output line 5, and the positive electrode side output terminal 5a that are connected together in series in this order.

A path from the negative electrode side input terminal 6a to the negative electrode side output terminal 7a is the negative electrode side path. Similarly to the first embodiment, this path includes the negative electrode side input terminal 6a, the negative electrode side input line 6, the negative electrode side input loop line 11a, the through-hole 12c, the negative electrode side output loop line 11b, the through-hole 12d, the negative electrode side output line 7, and the negative electrode side output terminal 7a that are connected together in series in this order.

The capacitor 3A embodies the first capacitor in the present invention, and a first end of the capacitor 3A is connected to a second end of the positive electrode side input loop line 10a via the connection line 8, and a second end of the capacitor 3A is grounded via the connection line 21.

The capacitor 3B embodies the second capacitor of the present invention, and a first end of the capacitor 3B is connected to the second end of the capacitor 3A via the connection line 21, and a second end of the capacitor 3B is connected to a second end of the negative electrode side input loop line 11a via the connection line 9.

That is, being different from the first embodiment, the noise filter circuit 1C is provided with the capacitor 3A and the capacitor 3B connected in series between the positive electrode side path and the negative electrode side path.

In addition, as illustrated in FIG. 19, the connection line 21 between the capacitor 3A and the capacitor 3B is electrically connected to the ground conductor 13 via the through-hole 12e.

That is, the noise filter circuit 1C is a four-terminal circuit in which the positive electrode side path and the negative electrode side path are grounded via the capacitor 3A and the capacitor 3B.

The capacitor 3A and the capacitor 3B being connected as above function as a filter against so-called common mode noise input in the same phase between the positive electrode side input terminal 4a and the negative electrode side input terminal 6a.

In addition, similarly to the first embodiment, each of the positive electrode side input loop line 10a, the positive electrode side output loop line 10b, the negative electrode side input loop line 11a, and the negative electrode side output loop line 11b has a rectangular loop shape with a part thereof opened. The positive electrode side input loop line 10a and the positive electrode side output loop line 10b are provided in opposite positions in the thickness direction of the double printed substrate 2, and the negative electrode side input loop line 11a and the negative electrode side output loop line 11b are provided in opposite positions in the thickness direction of the double printed substrate 2.

Note that, in the noise filter circuit 1C, the positive electrode side input loop line 10a and the positive electrode side output loop line 10b may be arranged to be entirely opposite to each other, but may be arranged to be partially opposite to each other.

Similarly, the negative electrode side input loop line 11a and the negative electrode side output loop line 11b may be arranged to be entirely opposite to each other, but may be arranged to be partially opposite to each other.

That is, in the noise filter circuit 1C, a mutual inductance value may be adjusted by shifting the position of the input loop line on the first surface of the dielectric layer 2A or the position of the output loop line on the second surface of the dielectric layer 2A.

Similarly to the first embodiment, a winding direction of a path from a first end to the second end of the positive electrode side input loop line 10a, and a winding direction of a path from a first end to a second end of the positive electrode side output loop line 10b are the same as each other. A winding direction of a path from a first end to the second end of the negative electrode side input loop line 11a, and a winding direction of a path from a first end to a second end of the negative electrode side output loop line 11b are the same as each other.

Also in the noise filter circuit 1C, loop sizes of and a relative positional relationship between the positive electrode side input loop line 10a and the positive electrode side output loop line 10b are respectively the same as loop sizes of and a positional relationship between the negative electrode side input loop line 11a and the negative electrode side output loop line 11b.

Next, operation of the noise filter circuit 1C according to the first embodiment will be described.

In the noise filter circuit 1C, similarly to the first embodiment, the positive electrode side input loop line 10a and the positive electrode side output loop line 10b are magnetically coupled together, and the negative electrode side input loop line 11a and the negative electrode side output loop line 11b are magnetically coupled together. When representing each of mutual inductances generated by the respective magnetic couplings by M and taking a coupling direction between the loop lines into consideration, the noise filter circuit 1C can be represented by an equivalent circuit illustrated in FIG. 21.

Figure 21:
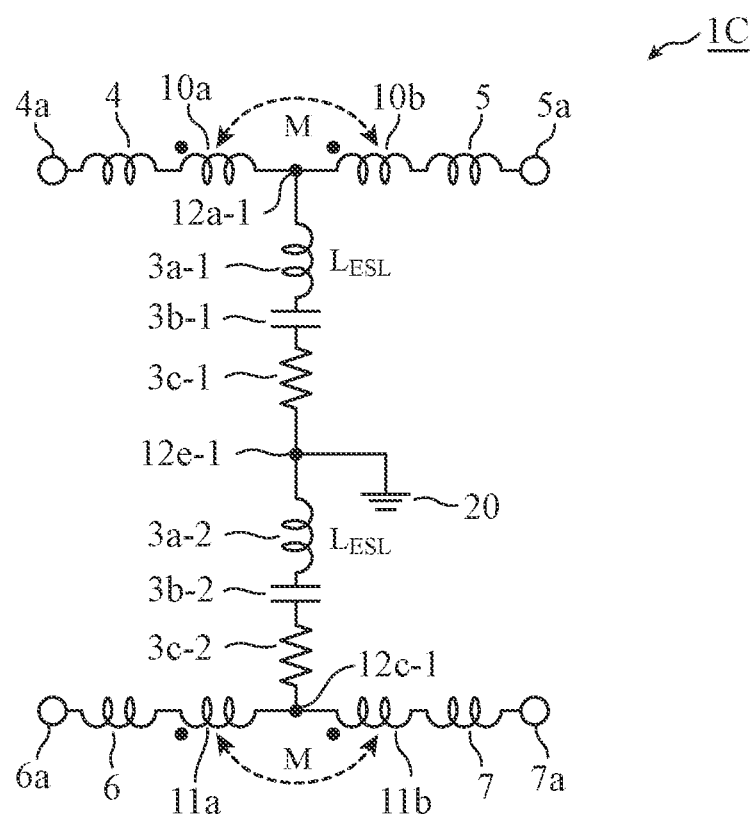
FIG. 21 is a diagram illustrating an equivalent circuit of the noise filter circuit according to the fourth embodiment.

A connection point 12a-1 illustrated in FIG. 21 corresponds to an arrangement position of the through-hole 12a illustrated in FIGS. 19 and 20, and a connection point 12c-1 corresponds to an arrangement position of the through-hole 12c. A connection point 12e-1 is connected to a ground point 20, and corresponds to an arrangement position of the through-hole 12e in FIGS. 19 and 20.

In the equivalent circuit illustrated in FIG. 21, a path between the connection point 12a-1 and the connection point 12e-1 is represented by a circuit in which an ESL 3a-1 having an inductance of $L_{ESL}$, a capacitance 3b-1, and an equivalent series resistance 3c-1 are connected together in series.

Similarly, in the equivalent circuit illustrated in FIG. 21, a path between the connection point 12c-1 and the connection point 12e-1 is represented by a circuit in which an ESL 3a-2 having an inductance of $L_{ESL}$, a capacitance 3b-2, and an equivalent series resistance 3c-2 are connected together in series.

It is known that, for a portion in which the positive electrode side input loop line 10a and the positive electrode side output loop line 10b are magnetically coupled together illustrated in FIG. 21, equivalent circuit conversion can be performed as follows.

To the positive electrode side input loop line 10a and the positive electrode side output loop line 10b, equivalent inductors each having the mutual inductance of M generated by the magnetic coupling of these loop lines are connected in series. To a path branching from the connection point 12a-1, an equivalent inductor having an inductance of −M, in which the sign of the mutual inductance generated by the magnetic coupling is reversed, is connected in series.

Also on the negative electrode side input loop line 11a and the negative electrode side output loop line 11b, equivalent circuit conversion similar to the above is performed.

Figure 22:
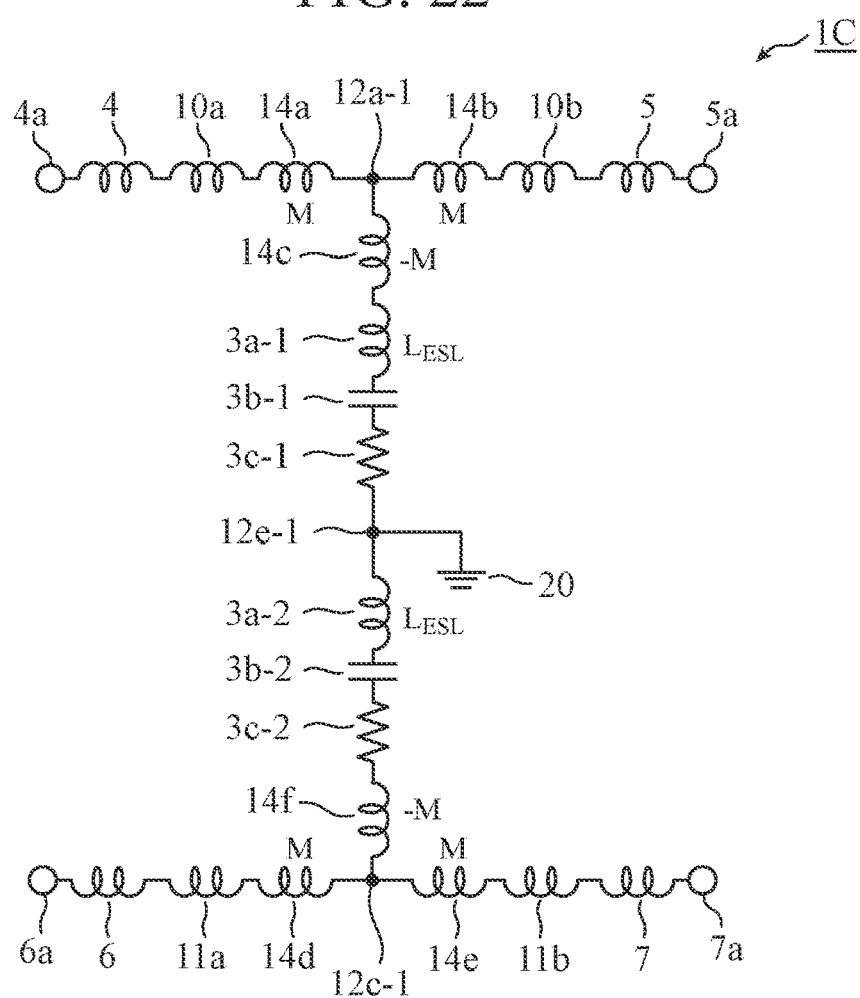
FIG. 22 is a diagram illustrating an equivalent circuit of the noise filter circuit according to the fourth embodiment to which the equivalent circuit conversion is applied.

By applying the above equivalent circuit conversion to two magnetic coupling portions in FIG. 21, a circuit illustrated in FIG. 22 is obtained as an equivalent circuit of the noise filter circuit 1C. In FIG. 22, equivalent inductors 14a to 14f are added as a result of the equivalent circuit conversion. Each of the equivalent inductors 14a, 14b, 14d, and 14e has an inductance of M, and each of the equivalent inductors 14c and 14f has an inductance of −M. Therefore, each inductance in the path between the connection point 12a-1 and the connection point 12e-1, and the path between the connection point 12c-1 and the connection point 12e-1 is $L_{ESL}$-M.

In the noise filter circuit 1C, to cause $L_{ESL}$ and M to be equal to each other, the magnetic coupling is adjusted between the positive electrode side input loop line 10a and the positive electrode side output loop line 10b, and the magnetic coupling is adjusted between the negative electrode side input loop line 11a and the negative electrode side output loop line 11b.

With this adjustment, the inductance of $L_{ESL}$ of the path between the connection point 12a-1 and the connection point 12e-1, and the inductance of $L_{ESL}$ of the path between the connection point 12c-1 and the connection point 12e-1 are both canceled and become substantially zero.

As a result, it is possible to reduce degradation of filter performance due to influence of the ESL 3a-1 and the ESL 3a-2.

Figure 23:
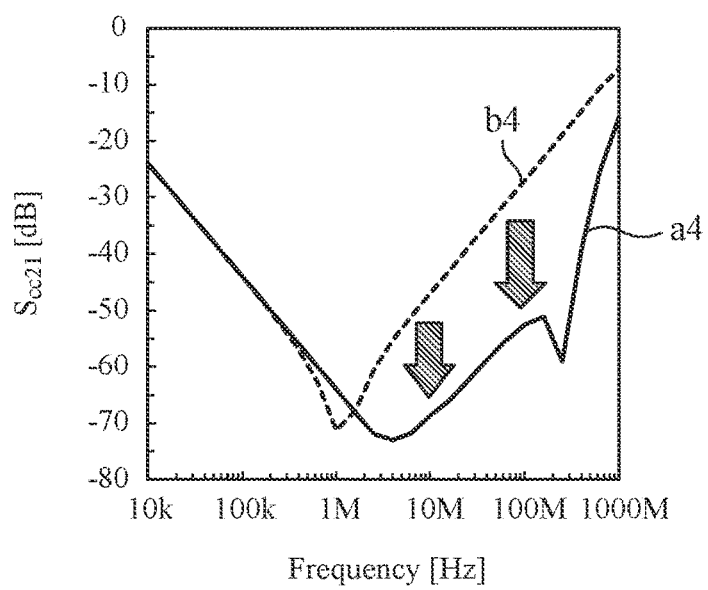
FIG. 23 is a graph illustrating an electromagnetic field calculation result ($S_{cc21}$) of a mixed mode S parameter representing the filter performance for common mode noise.

FIG. 23 is a graph illustrating an electromagnetic field calculation result ($S_{cc21}$) of a mixed mode S parameter representing the filter performance against the common mode noise. In FIG. 23, the horizontal axis that is a logarithmic axis indicates a frequency, and the vertical axis indicates a mixed mode S parameter (dB). In electromagnetic field calculation, two chip capacitors each having a capacitance of 10 µF are used as the capacitors, and the termination impedance of each of the input and output terminal is assumed to be 50Ω.

A solid curve denoted by a reference sign a4 is a calculation result in the noise filter circuit 1C and a broken curve denoted by a reference sign b4 is a calculation result in a noise filter circuit without the ESL cancellation structure.

As illustrated in FIG. 23, in the noise filter circuit 1C, degradation of the filter performance against the common mode noise is reduced on the higher frequency side than about 1 MHz that is the resonance frequency, as compared with the circuit without the ESL cancellation structure.

As described above, the noise filter circuit 1C according to the fourth embodiment is a four-terminal circuit in which the capacitor 3A and the capacitor 3B are connected between the positive electrode side line and the negative electrode side line, and has an ESL cancellation structure using two sets of coupling loops on the positive electrode side and the negative electrode side.

Since a positive electrode side ESL and a negative electrode side ESL are canceled by this ESL cancellation structure, it is possible to reduce degradation of the filter performance due to influence of these ESLs.

In particular, it is possible to reduce degradation of the filter performance against the common mode noise.

In the above, a case has been described where the positive electrode side input loop line 10a, the positive electrode side output loop line 10b, the negative electrode side input loop line 11a, and the negative electrode side output loop line 11b each have a rectangular loop shape; however, the loop shape is not limited to a rectangular shape.

That is, it is sufficient that the loop line in the fourth embodiment has a shape that generates a magnetic field in a certain direction inside the loop by the current flowing through the loop path, and the loop shape may be a circle, an ellipse, a polygon such as a rectangle, or the like.

In addition, a case has been described where chip capacitors are used as the capacitors 3A and 3B; however, the capacitors 3A and 3B are not limited to chip capacitors. For example, a capacitor such as a ceramic capacitor, a film capacitor, or an electrolytic capacitor may be used.

Fifth Embodiment

Figure 24:
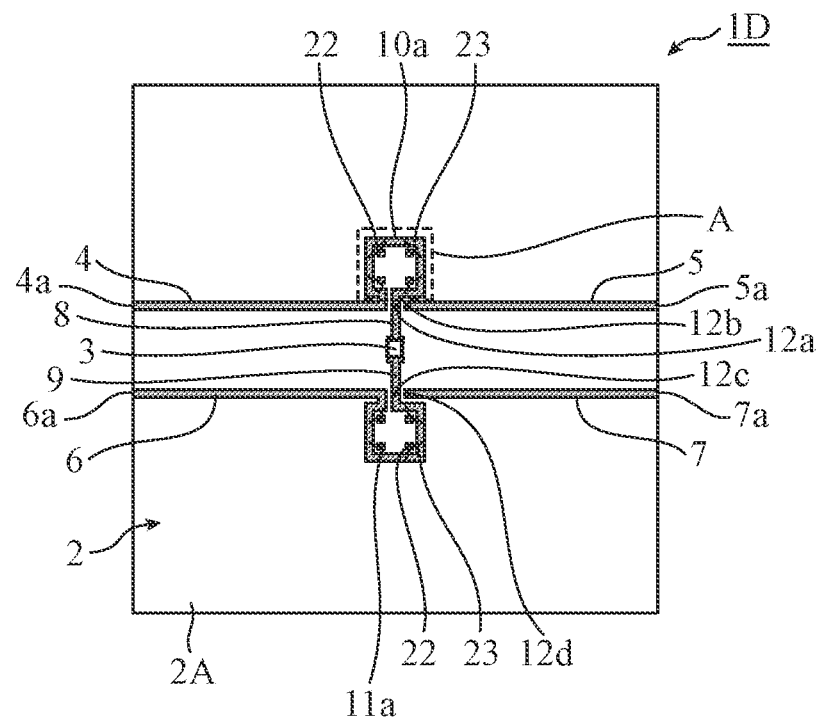
FIG. 24 is a top view illustrating a configuration of a noise filter circuit according to a fifth embodiment of the present invention.
Figure 25:
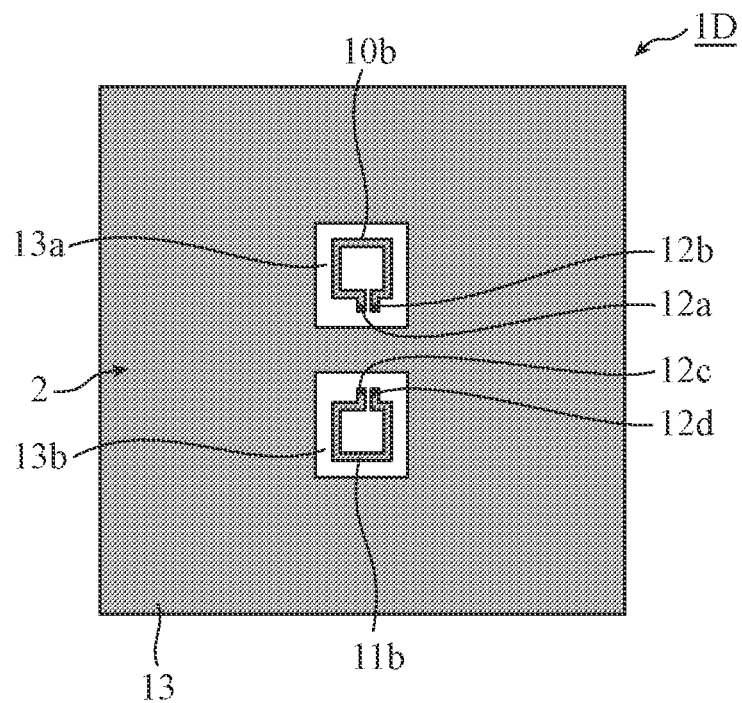
FIG. 25 is a top transparent view illustrating the configuration of the noise filter circuit according to the fifth embodiment.
Figure 26:
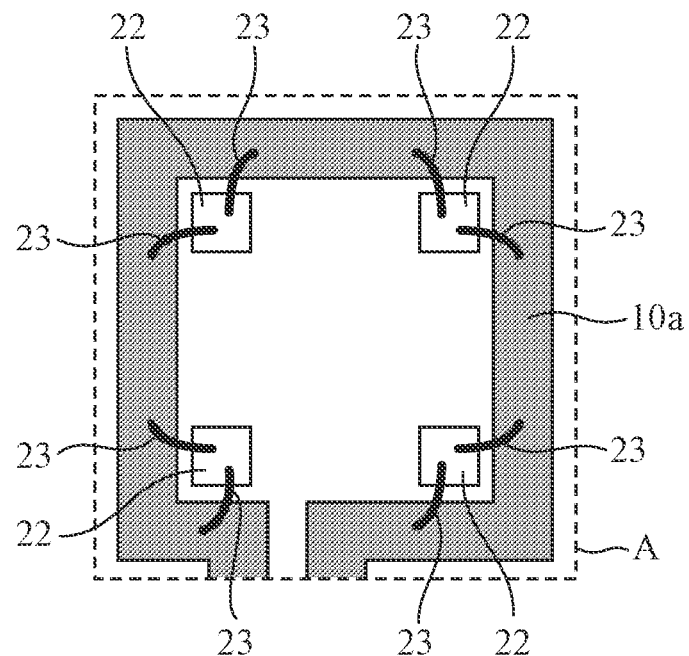
FIG. 26 is an enlarged view illustrating a broken line portion denoted by a reference sign A in FIG. 24.

FIG. 24 is a top view illustrating a configuration of a noise filter circuit 1D according to a fifth embodiment of the present invention. In FIG. 24, the same components as those in FIG. 1 are denoted by the same reference signs, and description thereof is omitted. FIG. 25 is a top transparent view illustrating the configuration of the noise filter circuit 1D. In FIG. 25, the same components as those in FIG. 2 are denoted by the same reference signs, and description thereof is omitted. FIG. 26 is an enlarged view illustrating a broken line portion denoted by a reference sign A in FIG. 24.

The noise filter circuit 1D has a configuration substantially similar to the noise filter circuit 1 described in the first embodiment except that the noise filter circuit 1D includes loop adjustment conductors 22 and bonding wires 23 inside each loop of the positive electrode side input loop line 10a and the negative electrode side input loop line 11a.

The loop adjustment conductors 22 embody the floating conductor portions in the present invention, and four loop adjustment conductors 22 are arranged inside each loop of the positive electrode side input loop line 10a and the negative electrode side input loop line 11a. In addition, the loop adjustment conductors 22 arranged inside the loop of the positive electrode side input loop line 10a are electrically connected to the positive electrode side input loop line 10a via the bonding wires 23. The loop adjustment conductors 22 arranged inside the loop of the negative electrode side input loop line 11a are electrically connected to the negative electrode side input loop line 11a by the bonding wires 23.

That is, the loop adjustment conductors 22 are floating conductors not connected to conductors other than the bonding wires 23.

For example, as described in the first embodiment, the mutual inductance generated by the magnetic coupling between the positive electrode side input loop line 10a and the positive electrode side output loop line 10b becomes smaller as the loop area of the current flowing through the conductor of the loop portion becomes smaller.

In the noise filter circuit 1D, as illustrated in FIG. 26, the loop adjustment conductors 22 are electrically connected to a plurality of positions of the positive electrode side input loop line 10a via the bonding wires 23. In this configuration, the loop area of the current flowing through the conductor of the loop portion becomes smaller, so that it is possible to reduce the mutual inductance generated by the magnetic coupling between the positive electrode side input loop line 10a and the positive electrode side output loop line 10b. Note that, the amount of this reduction can be adjusted by changing the number and the connecting positions of the bonding wires 23.

In addition, also in the magnetic coupling between the negative electrode side input loop line 11a and the negative electrode side output loop line 11b, similar adjustment can be made by the loop adjustment conductors 22 and the bonding wires 23.

As described above, in the noise filter circuit 1D according to the fifth embodiment, the loop adjustment conductors 22 are arranged inside each loop of the positive electrode side input loop line 10a and the negative electrode side input loop line 11a. These loop adjustment conductors 22 are electrically connected to the loop line via the bonding wires 23.

With this configuration, the mutual inductance generated by the coupling loops can be reduced. In addition, it is also possible to adjust the amount of reduction of the mutual inductance by changing the number and the connecting positions of the bonding wires 23.

For example, a case is considered where the magnetic coupling in the coupling loops becomes stronger than expected due to a manufacturing error of the noise filter circuit 1D or the like, and $L_{ESL}$ becomes smaller than M in the equivalent circuit illustrated in FIG. 4. In this case, for realizing a state where the ESL 3a is appropriately canceled ($L_{ESL}$=M), it is sufficient to adjust the amount of reduction in the mutual inductance of M by changing the number and the connecting positions of the bonding wires 23.

In the above description, four loop adjustment conductors 22 are arranged in each of the positive electrode side input loop line 10a and the negative electrode side input loop line 11a, and each loop adjustment conductor 22 is electrically connected to a loop line by two bonding wires 23; however, the configuration is not limited thereto.

For example, each loop adjustment conductor 22 may be electrically connected to a loop line by three or more bonding wires 23, or may be electrically connected to a loop line by one bonding wire 23.

That is, the number of the loop adjustment conductors 22 and the number of the bonding wires 23 may be any number as long as the amount of reduction of the mutual inductance of M can be adjusted so that the ESL 3a is appropriately canceled.

Further, means for electrically connecting the loop adjustment conductors 22 to the loop line are not limited to the bonding wires 23.

That is, in the fifth embodiment, the connection means of the loop adjustment conductors 22 is not limited as long as the loop adjustment conductors 22 can be electrically connected to the loop line so that the ESL 3a is appropriately canceled.

Further, in the fifth embodiment, a case has been described where the loop adjustment conductors 22 and the bonding wires 23 are provided inside each loop of the positive electrode side input loop line 10a and the negative electrode side input loop line 11a; however, the configuration is not limited thereto.

For example, the loop adjustment conductors 22 and the bonding wires 23 may be provided inside each loop of the positive electrode side output loop line 10b and the negative electrode side output loop line 11b.

That is, it is sufficient that the loop adjustment conductors 22 are provided inside the loop path of at least one of the positive electrode side input loop line 10a, the positive electrode side output loop line 10b, the negative electrode side input loop line 11a, and the negative electrode side output loop line 11b, and electrically connected to the loop line.

Further, in the fifth embodiment, a case has been described where the loop adjustment conductors 22 and the bonding wires 23 are provided in the configuration described in the first embodiment; however, the loop adjustment conductors 22 and the bonding wires 23 may be provided in the configurations described in any of the second to fourth embodiments, or may be provided in a configuration in a sixth embodiment described below. Even with such configurations, the effects similar to those described above can be obtained.

Sixth Embodiment

Figure 27:
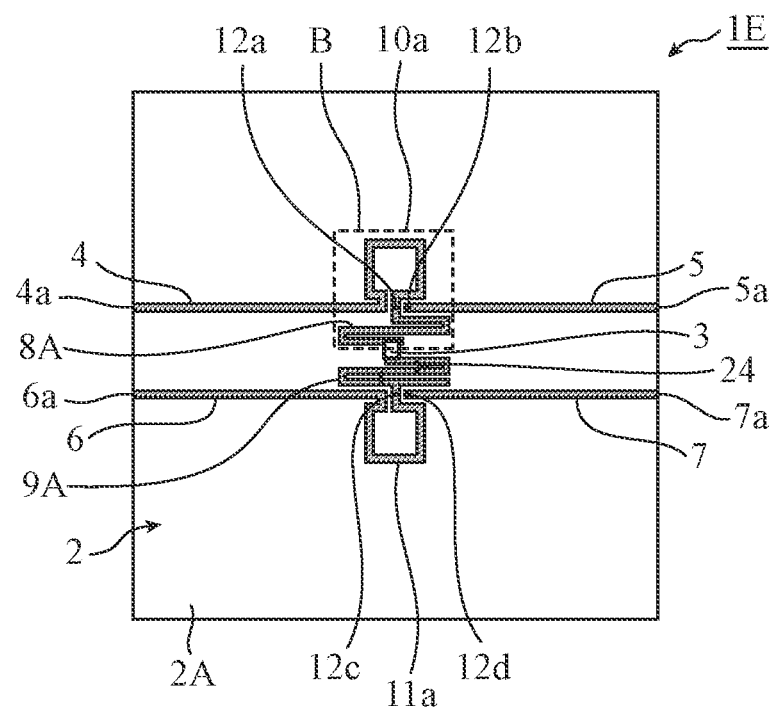
FIG. 27 is a top view illustrating a configuration of a noise filter circuit according to a sixth embodiment of the present invention.
Figure 28:
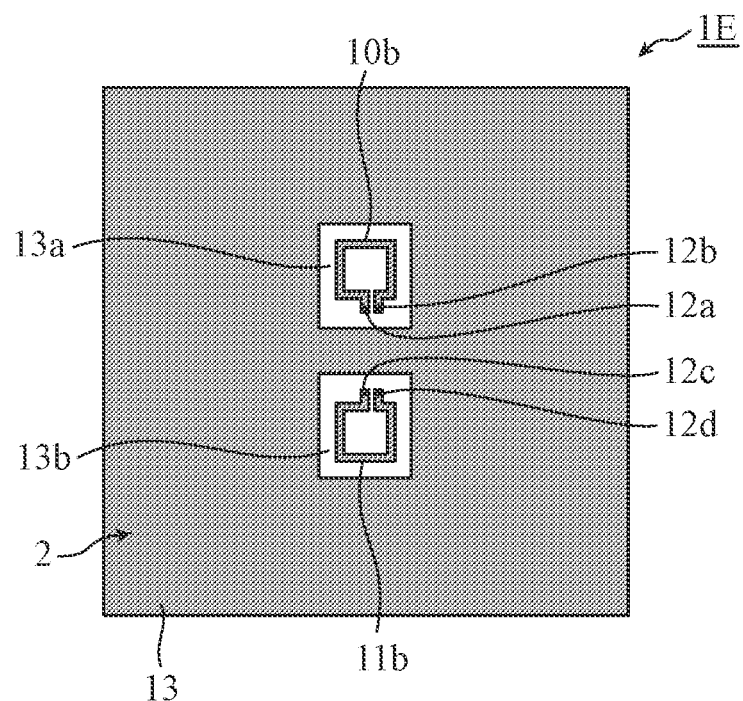
FIG. 28 is a top transparent view illustrating the configuration of the noise filter circuit according to the sixth embodiment.
Figure 29:
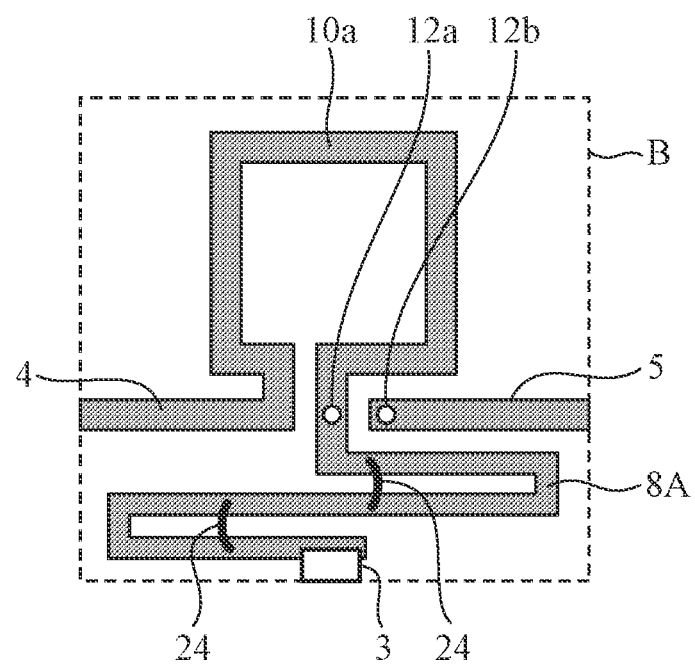
FIG. 29 is an enlarged view illustrating a broken line portion denoted by a reference sign B in FIG. 27.

FIG. 27 is a top view illustrating a configuration of a noise filter circuit 1E according to a sixth embodiment of the present invention. In FIG. 27, the same components as those in FIG. 1 are denoted by the same reference signs, and description thereof is omitted. FIG. 28 is a top transparent view illustrating the configuration of the noise filter circuit 1E. In FIG. 28, the same components as those in FIG. 2 are denoted by the same reference signs, and description thereof is omitted. FIG. 29 is an enlarged view illustrating a broken line portion denoted by a reference sign B in FIG. 27.

The noise filter circuit 1E has a configuration substantially similar to that of the noise filter circuit 1 described in the first embodiment except that each of a connection line 8A and a connection line 9A has a meandering structure.

The connection line 8A connects a first end of a capacitor 3 to a positive electrode side input loop line 10a, and is a meandering line as illustrated in FIG. 27. In addition, as illustrated in FIG. 29, some parts in the middle of the connection line 8A are electrically connected to each other by bonding wires 24 at a plurality of positions on the connection line 8A.

The connection line 9A connects a second end of the capacitor 3 to a negative electrode side input loop line 11a, and is a meandering line similar to the connection line 8A. In addition, some parts in the middle of the connection line 9A are electrically connected to each other by bonding wires 24.

In the equivalent circuit illustrated in FIG. 3, each inductance of the connection line 8 and the connection line 9 is a part of the inductance of $L_{ESL}$ of the ESL 3a.

On the other hand, in the noise filter circuit 1E, some parts of the line are electrically connected to each other by the bonding wires 24 in each of the meandering connection line 8A and the meandering connection line 9A. Thus, the electrical lengths of the respective connection line 8A and the connection line 9A are shortened, and as a result, the inductance of $L_{ESL}$ of the ESL 3a can be reduced.

Note that, the amount of reduction can be adjusted by changing the number of bonding wires 24 and the positions connecting the parts of the line to each other.

As described above, in the noise filter circuit 1E according to the sixth embodiment, the connection line 8A and the connection line 9A are meandering lines, and parts of the lines are electrically connected to each other by the bonding wires 24. With this configuration, it is possible to adjust the electrical length of each of the connection line 8A and connection line 9A.

For example, a case is considered where the magnetic coupling in the coupling loops becomes weaker than expected due to a manufacturing error of the noise filter circuit 1E or the like, so that $L_{ESL}$ becomes larger than M in the equivalent circuit illustrated in FIG. 4. In this case, by adjusting $L_{ESL}$ by changing the number and the connecting positions of the bonding wires 24, it is possible to appropriately cancel the ESL 3a ($L_{ESL}$=M).

In the above description, parts of the lines are electrically connected to each other by the bonding wires 24 at two pairs of positions in each of the connection line 8A and the connection line 9A; however, the configuration is not limited thereto.

For example, parts of the lines may be electrically connected to each other by the bonding wires 24 at three or more sets of positions, or may be electrically connected to each other at only one set of positions.

That is, the number and the positions of the electrical connecting points of the meandering lines are preferably determined for causing the amount of reduction of $L_{ESL}$ to be adjustable so that the ESL 3a can be appropriately canceled.

Further, means for electrically connecting parts of the lines are not limited to the bonding wires 24. That is, in the sixth embodiment, it is sufficient that the parts of the lines can be electrically connected to each other in the connection line 8A and the connection line 9A so that the ESL 3a is appropriately canceled, and the connection means are not limited to the bonding wires.

Further, in the sixth embodiment, a case has been described where the connection line 8A, the connection line 9A, and the bonding wires 24 are provided to the configuration described in the first embodiment; however, they may be provided to the configurations described in any of the third to fifth embodiments.

For example, in the configuration illustrated in the third embodiment, the electrical length of the connection line 17 may be adjusted by forming the connection line 17 as a meandering line, and electrically connecting some parts of the line to each other.

Further, in the configuration described in the fourth embodiment, the electrical length of the connection line 21 may be adjusted by forming the connection line 21 as a meandering line, and electrically connecting some parts of the line to each other.

Further, in the configuration illustrated in the fourth embodiment, the electrical lengths of the connection line 8 and the connection line 9 may be adjusted by forming the connection line 8 and the connection line 9 as meandering lines, and electrically connecting some parts of each of the lines to each other.

Further, in the configuration illustrated in the fourth embodiment, the electrical lengths of the connection line 8, the connection line 9, and the connection line 21 may be adjusted by forming the connection line 8, the connection line 9, and the connection line 21 as meandering lines, and electrically connecting some parts of each of the lines to each other.

Even with such configurations, the effects similar to those described before can be obtained.

Note that, in the invention of the present application, within the scope of the invention, free combination of the embodiments, modification of any component of each embodiment, or omission of any component in each embodiment can be made.

INDUSTRIAL APPLICABILITY

Since a noise filter circuit according to the present invention has an ESL cancellation structure that can be used for a line-to-line capacitor without degrading the degree of balance between lines, it can be used for various wireless communication devices.

REFERENCE SIGNS LIST 1, 1A to 1E, 100: Noise filter circuit, 2, 101: Double printed substrate, 2A, 101A: Dielectric layer, 3, 3-1, 3A, 3B, 102: Capacitor, 3b, 3b-1, 3b-2, 102b: Capacitance, 3c, 3c-1, 3c-2, 102c: Equivalent series resistance, 4, 103: Positive electrode side input line, 4a, 103a: Positive electrode side input terminal, 5, 104: Positive electrode side output line, 5a, 104a: Positive electrode side output terminal, 6, 105: Negative electrode side input line, 6a, 105a: Negative electrode side input terminal, 7, 106: Negative electrode side output line, 7a, 106a: Negative electrode side output terminal, 8, 8A, 9, 9A, 17, 21, 107, 108: Connection line, 10a, 10a-1, 109a: Positive electrode side input loop line, 10b, 10b-1, 109b: Positive electrode side output loop line, 11a, 11a-1: Negative electrode side input loop line, 11b, 11b-1: Negative electrode side output loop line, 12a to 12f, 110a, 110b: Through-hole, 12a-1, 12c-1, 12e-1, 110a-1, 110b-1, 110c: Connection point, 13: Ground conductor, 13a to 13d: Portion where no conductor is arranged, 14a to 14f: Equivalent inductor, 15: Input line, 15a: Input terminal, 16: Output line, 16a: Output terminal, 18: Input loop line, 19: Output loop line, 20: Ground point, 22: Loop adjustment conductor, 23, 24: Bonding wire

The invention claimed is:

1. A noise filter circuit comprising
a first input line having a first end connected to a first input terminal;
a first output line having a first end connected to a first output terminal;
a second input line having a first end connected to a second input terminal;
a second output line having a first end connected to a second output terminal;
a first input loop line having a first end connected to a second end of the first input line;
a first output loop line connected in series between a second end of the first input loop line and a second end of the first output line;
a second input loop line having a first end connected to a second end of the second input line;
a second output loop line connected in series between a second end of the second input loop line and a second end of the second output line;
a capacitor connected in series between the second end of the first input loop line and the second end of the second input loop line; and
a substrate including a dielectric layer and on which, on a first surface of the dielectric layer, the first input line, the first output line, the second input line, the second output line, the first input loop line, the second input loop line, and the capacitor are provided, and on a second surface of the dielectric layer, the first output loop line is provided in an opposite position to the first input loop line in a thickness direction of the dielectric layer, and the second output loop line is provided in an opposite position to the second input loop line in the thickness direction of the dielectric layer, wherein
a winding direction of the first input loop line is the same as a winding direction of the first output loop line,
a winding direction of the second input loop line is the same as a winding direction of the second output loop line, and
a loop size of the first input loop line, a loop size of the first output loop line, and a relative positional relationship between the first input loop line and the first output loop line are respectively the same as a loop size of the second input loop line, a loop size of the second output loop line, and a positional relationship between the second input loop line and the second output loop line.

2. The noise filter circuit according to claim 1, wherein the first input loop line and the first output loop line, and the second input loop line and the second output loop line are arranged in a region below the capacitor.

3. The noise filter circuit according to claim 1, further comprising a plurality of floating conductor portions provided inside a loop path of at least one of the first input loop line, the first output loop line, the second input loop line, and the second output loop line, and electrically connected to the at least one of the first input loop line, the first output loop line, the second input loop line, and the second output loop line.

4. The noise filter circuit according to claim 1, wherein at least one of a connection line connecting the first input loop line to the capacitor and a connection line connecting the second input loop line to the capacitor is a meandering line, and the meandering line has parts electrically connected to each other.

5. A noise filter circuit comprising:
an input line having a first end connected to an input terminal;
an output line having a first end connected to an output terminal;
an input loop line having a first end connected to another end of the input line;
an output loop line connected in series between another end of the input loop line and another end of the output line;
a capacitor including a first end connected to said another end of the input loop line;
a substrate including a dielectric layer and on which, on a first surface of the dielectric layer, the input line, the output line, the input loop line, and the capacitor are provided, and on a second surface of the dielectric layer, the output loop line is provided in an opposite position to the input loop line in a thickness direction of the dielectric layer, and a ground conductor is provided around the output loop line leaving a region surrounding said output loop line where no ground conductor is provided; and
a plurality of through-holes extending in the thickness direction of the dielectric layer, wherein
the region surrounding said output loop line where no ground conductor is provided has an area larger than an area required to arrange the output loop line,
the output loop line is arranged inside the region where no ground conductor is provided,
the input loop line and the output loop line are electrically connected together by one of the plurality of through-holes,
the capacitor and the ground conductor are electrically connected together by one of the plurality of through-holes,
the output loop line and the output line are electrically connected together by one of the plurality of through-holes, and a winding direction of the input loop line is the same as a winding direction of the output loop line.

6. The noise filter circuit according to claim 5, further comprising a plurality of floating conductor portions provided inside a loop path of at least one of the input loop line and the output loop line, and electrically connected to the at least one of the input loop line and the output loop line.

7. The noise filter circuit according to claim 5, wherein a connection line connecting the input loop line to the capacitor is a meandering line, and parts of the connection line are electrically connected to each other.

8. A noise filter circuit comprising:
a first input line having a first end connected to a first input terminal;
a first output line having a first end connected to a first output terminal;
a second input line having a first end connected to a second input terminal;
a second output line having a first end connected to a second output terminal;
a first input loop line having a first end connected to a second end of the first input line;
a first output loop line connected in series to a second end of the first input loop line and a second end of the first output line;
a second input loop line having a first end connected to a second end of the second input line;
a second output loop line connected in series between a second end of the second input loop line and a second end of the second output line;
a first capacitor having a first end connected to the second end of the first input loop line, and a second end grounded;
a second capacitor having a first end connected to a second end of the first capacitor, and a second end connected to the second end of the second input loop line; and
a substrate including a dielectric layer and on which, on a first surface of the dielectric layer, the first input line, the first output line, the second input line, the second output line, the first input loop line, the second input loop line, the first capacitor, and the second capacitor are provided, and on a second surface of the dielectric layer, the first output loop line is provided in an opposite position to the first input loop line in a thickness direction of the dielectric layer, and the second output loop line is provided in an opposite position to the second input loop line in the thickness direction of the dielectric layer, wherein a winding direction of the first input loop line is the same as a winding direction of the first output loop line, a winding direction of the second input loop line is the same as a winding direction of the second output loop line, and a loop size of the first input loop line, a loop size of the first output loop line, and a relative positional relationship between the first input loop line and the first output loop line are respectively the same as a loop size of the second input loop line, a loop size of the second output loop line, and a positional relationship between the second input loop line and the second output loop line.

9. The noise filter circuit according to claim 8, further comprising a plurality of floating conductor portions provided inside a loop path of at least one of the first input loop line, the first output loop line, the second input loop line, and the second output loop line, and electrically connected to the at least one of the first input loop line, the first output loop line, the second input loop line, and the second output loop line.

10. The noise filter circuit according to claim 8, wherein at least one of a connection line connecting the first input loop line to the first capacitor, a connection line connecting the second input loop line to the second capacitor, and a connection line connecting the first capacitor to the second capacitor is a meandering line, and the meandering line has parts electrically connected to each other.

* * * * *